US012580722B2

(12) United States Patent     (10) Patent No.:    US 12,580,722 B2

Burm et al.             (45) Date of Patent:     Mar. 17, 2026

(54) INTEGRATED CIRCUIT FOR DETECTING FREQUENCY AND PHASE OF CLOCK SIGNAL, OPERATING METHOD THEREOF, AND CLOCK AND DATA RECOVERY CIRCUIT INCLUDING INTEGRATED CIRCUIT

(71) Applicant: SAMSUNG ELECTRONICS CO., LTD., Suwon-si (KR)

(72) Inventors: Jinwook Burm, Suwon-si (KR); Jongmin Park, Suwon-si (KR)

(73) Assignees: SAMSUNG ELECTRONICS CO., LTD., Suwon-si (KR); Sogang University Research Foundation, Seoul (KR)

( * ) Notice: Subject to any disclaimer, the term of this patent is extended or adjusted under 35 U.S.C. 154(b) by 1 day.

(21) Appl. No.: 18/894,658

(22) Filed: Sep. 24, 2024

(65) Prior Publication Data

US 2025/0105998 A1     Mar. 27, 2025

(30) Foreign Application Priority Data

Sep. 25, 2023    (KR) ........................ 10-2023-0128528
Nov. 29, 2023    (KR) ........................ 10-2023-0170067

(51) Int. Cl.
    *H04L 7/00*         (2006.01)
    *H03K 3/037*       (2006.01)

(52) U.S. Cl.
    CPC ........... *H04L 7/0016* (2013.01); *H03K 3/037* (2013.01)

(58) Field of Classification Search
    CPC ........ H04L 7/0016; H04L 7/033; H03K 3/037
    See application file for complete search history.

(56) References Cited

U.S. PATENT DOCUMENTS

| | | | |
|---|---|---|---|
| 7,482,841 B1 | 1/2009 | Nguyen et al. | |
| 7,613,254 B2 | 11/2009 | Moriizumi | |
| 9,455,725 B2 | 9/2016 | Hung et al. | |
| 9,813,069 B1 | 11/2017 | Chattopadhyay et al. | |
| 10,141,940 B2 | 11/2018 | Jeong et al. | |
| 10,637,637 B2 | 4/2020 | Goudarzi et al. | |
| 10,924,119 B1 * | 2/2021 | Tak | H03L 7/085 |
| 11,012,077 B2 | 5/2021 | Shin et al. | |
| 11,349,485 B2 * | 5/2022 | Kao | H03L 7/087 |
| 11,398,826 B1 | 7/2022 | Sengupta et al. | |
| 2006/0202875 A1 * | 9/2006 | Fujisawa | G06F 1/025 |
| | | | 341/100 |
| 2014/0218221 A1 * | 8/2014 | Wortman | H04L 7/0012 |
| | | | 341/100 |
| 2022/0109555 A1 | 4/2022 | Abramzon | |

FOREIGN PATENT DOCUMENTS

KR        10-2509984 B1     3/2023

* cited by examiner

*Primary Examiner* — Jean B Corrielus
(74) *Attorney, Agent, or Firm* — Morgan, Lewis & Bockius LLP

(57) ABSTRACT

An integrated circuit includes a phase shifted data generation circuit, a synchronization circuit, and a control signal generation circuit configured to generate a reference clock control signal that controls at least one of a phase and a frequency of the reference clock signal by performing a logical operation on a plurality of received synchronization data.

20 Claims, 19 Drawing Sheets

FIG. 7C

FUP='1'

FDN='1'

1

INTEGRATED CIRCUIT FOR DETECTING FREQUENCY AND PHASE OF CLOCK SIGNAL, OPERATING METHOD THEREOF, AND CLOCK AND DATA RECOVERY CIRCUIT INCLUDING INTEGRATED CIRCUIT

CROSS-REFERENCE TO RELATED APPLICATION

This application claims priority under 35 U.S.C. § 119 to Korean Patent Application No. 10-2023-0128528 filed on Sep. 25, 2023, and 10-2023-0170067 filed on Nov. 29, 2023, the disclosures of which are incorporated by reference herein in their entireties.

TECHNICAL FIELD

Embodiments of the inventive concept relate to an integrated circuit and a clock and data recovery circuit, and more particularly, to an integrated circuit that detects a frequency and phase of a clock signal, an operating method of the integrated circuit, and a clock and data recovery circuit including the integrated circuit.

DISCUSSION OF RELATED ART

Instead of directly receiving a clock signal from a transmitting device, a receiving device may employ a clock and data recovery (CDR) circuit for recovering the clock signal from received data. The CDR circuit may contribute to reducing the complexity of a communication channel between the transmitting device and the receiving device and improving the communication speed.

SUMMARY

Embodiments of the inventive concept provide an integrated circuit that stably operates despite data distortion, an operating method of the integrated circuit, and a clock and data recovery circuit including the integrated circuit.

According to an embodiment of the inventive concept, there is provided an integrated circuit including a phase shifted data generation circuit configured to generate a plurality of phase shifted data from input data, based on a plurality of clock signals having different phases, a synchronization circuit configured to generate a plurality of synchronization data by applying the plurality of clock signals to the plurality of received phase shifted data, and a control signal generation circuit configured to generate a reference clock control signal that controls at least one of a phase and a frequency of the reference clock signal by performing a logical operation on the plurality of received synchronization data. The plurality of clock signals includes the reference clock signal and at least one phase shifted clock signal having a phase difference of a predetermined interval with respect to the reference clock signal, and a phase interval between two data having a largest phase difference from among the plurality of synchronization data on which the logical operation is based is greater than a signal cycle of the reference clock signal.

According to an embodiment of the inventive concept, there is provided an operating method of an integrated circuit that generates a phase control signal that controls a phase of a reference clock signal and a frequency control signal controlling a frequency of the reference clock signal, based on input data and the reference clock signal, the method including generating a plurality of phase shifted data from the input data, based on a plurality of clock signals having different phases, generating a plurality of synchronization data by applying the plurality of clock signals to the plurality of phase shifted data, and generating the phase control signal and the frequency control signal by performing a logical operation on the plurality of synchronization data. The plurality of clock signals includes the reference clock signal and at least one phase shifted clock signal having a phase difference of a predetermined interval with respect to the reference clock signal, and a phase interval between two data having a largest phase difference from among the plurality of synchronization data on which the logical operation is based is greater than a signal cycle of the reference clock signal.

According to an embodiment of the inventive concept, there is provided a clock and data recovery circuit including a phase and frequency detection circuit configured to generate a phase control signal that controls a phase of a reference clock signal and a frequency control signal that controls a frequency of the reference clock signal, based on input data and the reference clock signal, a loop filter configured to generate a frequency control word that controls a frequency of the reference clock signal, based on the received phase control signal and the frequency control signal, and an oscillator configured to generate the reference clock signal by oscillating based on the received frequency control signal. The phase and frequency detection circuit is configured to generate the frequency control signal by performing a logical operation on a plurality of first data generated based on the received reference clock signal and the input data, and a phase interval between two data having a largest phase difference from among the plurality of first data on which the logical operation is based is greater than a signal cycle of the reference clock signal.

BRIEF DESCRIPTION OF THE DRAWINGS

The above and other features of the present inventive concept will become more apparent by describing in detail embodiments thereof with reference to the accompanying drawings, in which:

FIGS. 7A to 7C are diagrams showing a frequency detection method of a phase and frequency detector, according to an embodiment;

DETAILED DESCRIPTION OF THE EMBODIMENTS

Figure 1:
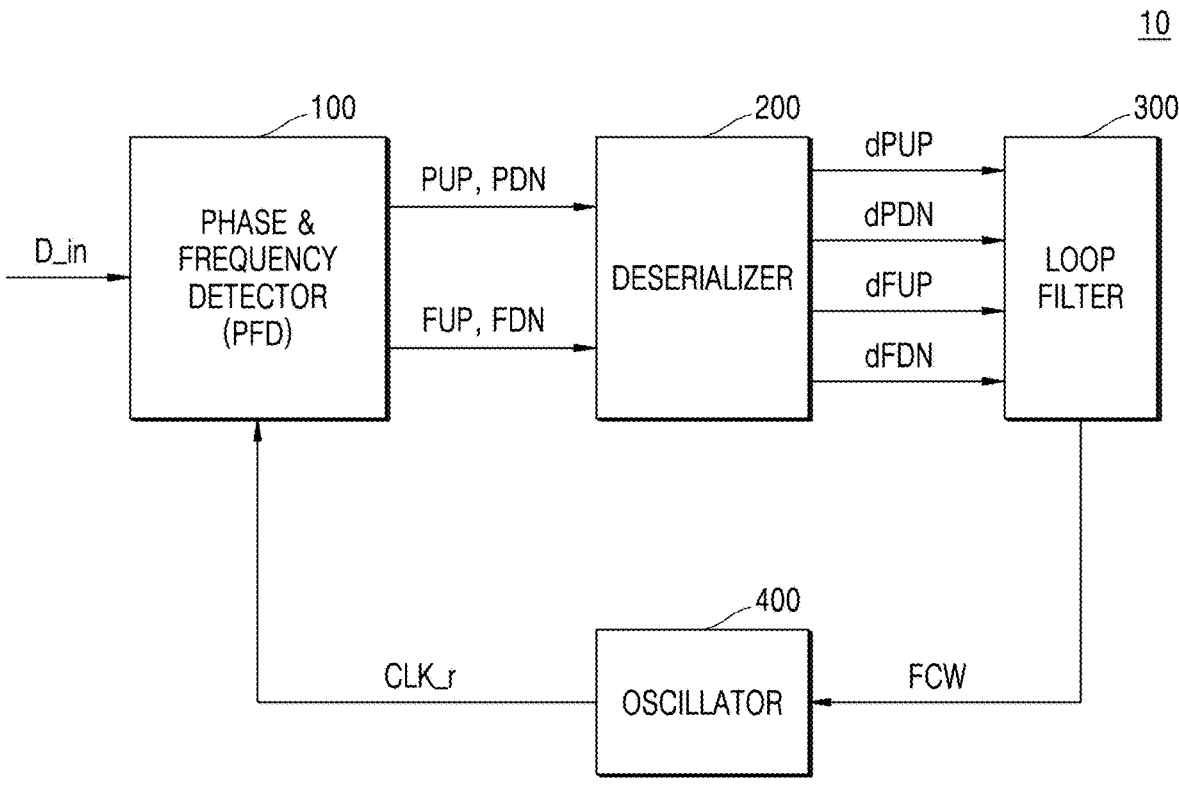
FIG. 1 is a block diagram showing a clock and data recovery circuit, according to an embodiment.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

FIG. 1 is a block diagram showing a clock and data recovery circuit 10 according to an embodiment.

The clock and data recovery circuit 10 may include a phase and frequency detector 100, a deserializer 200, a loop filter 300, and an oscillator 400. In some cases, the clock and data recovery circuit 10 may further include an equalizer, which may improve signal characteristics of input data D_in. The equalizer may amplify the input data D in or process data through a band pass filter to easily detect transition of the data. For example, the clock and data recovery circuit 10 may further include a continuous-time linear equalizer (CTLE) that may improve jitter characteristics of the received input data D_in. The clock and data recovery circuit 10 may receive the input data D_in to recover clock and data. In an embodiment, the clock and data recovery circuit 10 may be implemented as a single-loop reference-less clock and data recovery (CDR) circuit. Illustration is exemplary, and the clock and data recovery circuit 10 may be configured as an analog circuit. For example, the clock and data recovery circuit 10 may include the phase and frequency detector 100, a charge pump, a loop filter or a low-pass filter, and the oscillator 400.

The phase and frequency detector 100 may detect a phase and a frequency. The phase and frequency detector 100 may generate a phase control signal for controlling a phase of a reference clock signal CLK_r and a frequency control signal for controlling a frequency of the reference clock signal CLK_r, based on the input data D_in and the reference clock signal CLK_r. In an embodiment, the phase control signal may include a phase pull signal PUP and a phase delay signal PDN, and the frequency control signal may include a frequency up signal FUP and a frequency down signal FDN. In an embodiment, the phase and frequency detector 100 may receive a plurality of clock signals including the reference clock signal CLK_r from the oscillator 400 and generate the phase control signal and the frequency control signal by detecting a phase and frequency difference between the plurality of clock signals and the input data D_in. The phase and frequency detector 100 may output phase shifted data by checking input data through one of the plurality of clock signals. The phase and frequency detector 100 may be referred to as a phase and frequency detection circuit.

The deserializer 200 may parallelize the phase control signal and the frequency control signal that are generated by the phase and frequency detector 100 to a parallelized phase pull signal dPUP, a parallelized phase delay signal dPDN, a parallelized frequency up signal dFUP, and a parallelized frequency down signal dFDN, respectively. The deserializer 200 may be implemented as a de-multiplexer and may de-multiplex the phase control signal and the frequency control signal into a signal expressed by a certain number of bits. The deserializer 200 may provide parallelized control signals to the loop filter 300.

The loop filter 300 may filter a parallel phase control signal and a parallel frequency control signal and generate a frequency control word (FCW) to control a frequency of the reference clock signal CLK_r based on the filtered signals. The loop filter 300 may provide the generated frequency control word FCW to the oscillator 400. The frequency control word FCW may be data or a signal that may represent numbers, and may provide data for frequency control to the oscillator 400.

In an embodiment, when the frequency control signal indicates an increase in frequency, the loop filter 300 may generate the frequency control word FCW to cause the oscillator 400 to increase a frequency of the reference clock signal CLK_r. For example, when the frequency up signal FUP indicates a first logic level (e.g., '1'), the loop filter 300 may generate the frequency control word FCW to cause the oscillator 400 to increase a frequency of the reference clock signal CLK_r. Similarly, in an embodiment, when the frequency control signal indicates a decrease in frequency, the loop filter 300 may generate the frequency control word FCW to cause the oscillator 400 to decrease a frequency of the reference clock signal CLK_r. For example, when the frequency down signal FDN indicates a first logic level (e.g., '1'), the loop filter 300 may generate the frequency control word FCW to cause the oscillator 400 to decrease a frequency of the reference clock signal CLK_r. In an embodiment, when the frequencies of the input data D_in and the reference clock signal CLK_r match, the loop filter 300 may determine frequency lock, and after determining frequency lock, the loop filter 300 may generate the frequency control word FCW based on the phase control signal.

The loop filter 300 is exemplary and may be a digital loop filter implemented as a digital circuit, or may be implemented as an analog circuit such as a low pass filter (LPF) to output a signal to control the oscillator 400.

The oscillator 400 may generate the reference clock signal CLK_r by oscillating based on the frequency control word FCW provided from the loop filter 300. In an embodiment, the oscillator 400 may generate a plurality of clock signals including the reference clock signal CLK_r and provide the plurality of clock signals to the phase and frequency detector 100. In an embodiment, the oscillator 400 may generate the plurality of clock signals at full-rate, half-rate, quarter-rate and a higher rate depending on a relationship with the input data D_in. A clock signal operating at full-rate may use a clock signal having the same cycle as an input data cycle, and a clock signal operating at full-rate may use a clock signal having a cycle twice the input data cycle. A rate may have technical differences depending on how many clocks are used to cover input data, and a detailed description of the case of operating at full-rate and half-rate will be described below with reference to FIGS. 3A and 3B. It will be fully understood that embodiments corresponding to quarter-rate or higher rates are implemented in the same manner as full-rate and half-rate.

In an embodiment, the oscillator 400 may be implemented as a digital controlled oscillator (DCO). This is exemplary, and in some cases, the oscillator 400 may be configured as a voltage controlled oscillator (VCO) that receives a voltage input.

In an embodiment, the phase and frequency detection circuit may generate a frequency control signal by performing a logical operation on a plurality of first data generated based on a received reference clock signal and input data. In this case, a phase interval between two data having the largest phase difference from among the plurality of first data on which the logical operation is based may be greater than a signal cycle of the reference clock signal. Generating of the frequency control signal according to the phase interval and the logic operation will be described in more detail with reference to the drawings below.

Figure 2:
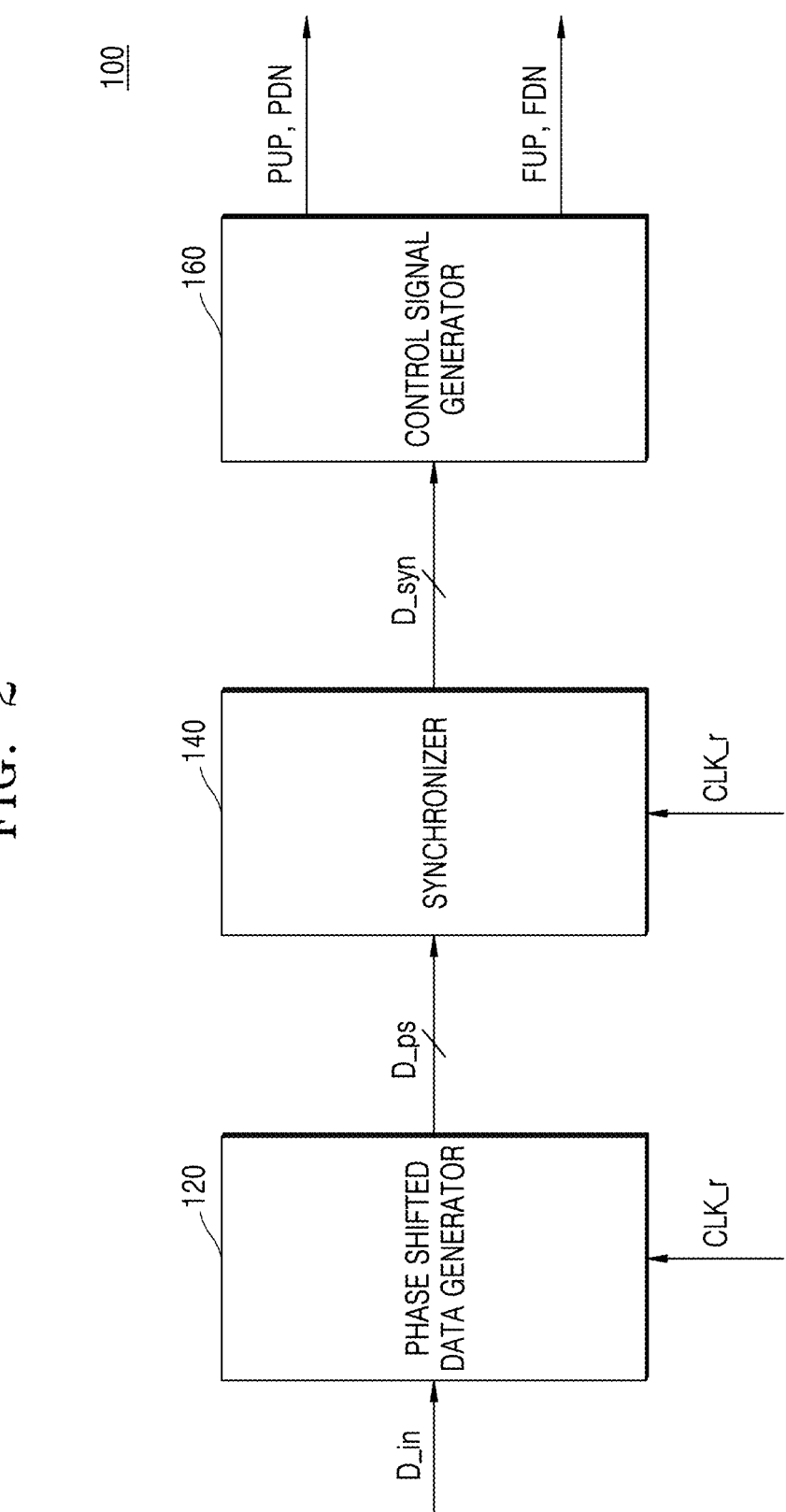
FIG. 2 is a block diagram showing a phase and frequency detector, according to an embodiment.

FIG. 2 is a block diagram showing a phase and frequency detector, according to an embodiment.

Referring to FIG. 2, the phase and frequency detector 100 may include a phase shifted data generator 120, a synchronizer 140, and a control signal generator 160. The phase and frequency detector 100 may be implemented as an integrated circuit and may be used in a clock and data recovery circuit CDR as shown in FIG. 1 or a phase locked loop PLL. For convenience of explanation, repeated descriptions of FIG. 1 in relation to the phase and frequency detector 100 are omitted, and a description of FIG. 2 is given below with reference to FIG. 1.

The phase and frequency detector 100 according to an example may be implemented as a Bang-Bang phase and frequency detector (BBPFD). That is, the phase and frequency detector 100 may be a binary phase and frequency detector that operates in a binary format.

The phase shifted data generator 120 may receive the input data D_in and the reference clock signal CLK_r. In an embodiment, the phase shifted data generator 120 may receive a plurality of clock signals including the reference clock signal CLK_r. The phase shifted data generator 120 may generate a plurality of phase shifted data D_ps from the input data D_in based on a plurality of clock signals. In an embodiment, the phase shifted data generator 120 may generate a plurality of phase shifted data D_ps by capturing the input data D_in at a rising edge and/or a falling edge of the plurality of clock signals. To this end, the phase shifted data generator 120 may include a plurality of flip-flops. The phase shifted data generator 120 may be referred to as a phase shifted data generation circuit.

The synchronizer 140 may generate a plurality of synchronization data D_syn by applying a plurality of clock signals to the plurality of phase shifted data D_ps provided from the phase shifted data generator 120. In an embodiment, a plurality of synchronization data may include data D0, data D0+, and data D0++ that are generated based on a phase of the reference clock signal CLK_r, and data D180 and data D180+ that are generated based on a phase of an inverted reference clock signal. The plurality of synchronization data is described in more detail with reference to the drawings below. The synchronizer 140 may be referred to as a synchronization circuit.

The control signal generator 160 may generate at least one of the phase control signal that controls a phase of a plurality of clock signals and a frequency control signal that controls a frequency of the plurality of clock signals by performing a logical operation on the plurality of synchronization data. For example, the control signal generator 160 may perform a logical operation by using at least some of OR, AND, NOT, NOR, NAND, XOR, and XNOR operations on at least some of a plurality of synchronization data. The control signal generator 160 may detect a phase and frequency difference between the input data D_in and the reference clock signal CLK_r through a logical operation. The control signal generator 160 may be referred to as a control signal generation circuit.

In an embodiment, the phase control signal may include a phase pull signal PUP and a phase delay signal PDN. When a phase of the reference clock signal CLK_r is later than a phase of the input data D_in according to the logical operation of the control signal generator 160, the control signal generator 160 may generate the phase pull signal PUP of a first logic level (e.g., '1'). Similarly, when a phase of the reference clock signal CLK_r is earlier than a phase of the input data D_in according to the logical operation of the control signal generator 160, the control signal generator 160 may generate the phase delay signal PDN of a first logic level (e.g., '1').

In an embodiment, the frequency control signal may include a frequency up signal FUP and a frequency down signal FDN. When a frequency of the reference clock signal CLK_r is small according to a logical operation of the control signal generator 160, the control signal generator 160 may generate the frequency up signal FUP of the first logic level (e.g., '1'). Similarly, when a frequency of the reference clock signal CLK_r is large according to a logical operation of the control signal generator 160, the control signal generator 160 may generate the frequency down signal FDN of the first logic level (e.g., '1').

Figure 3A:
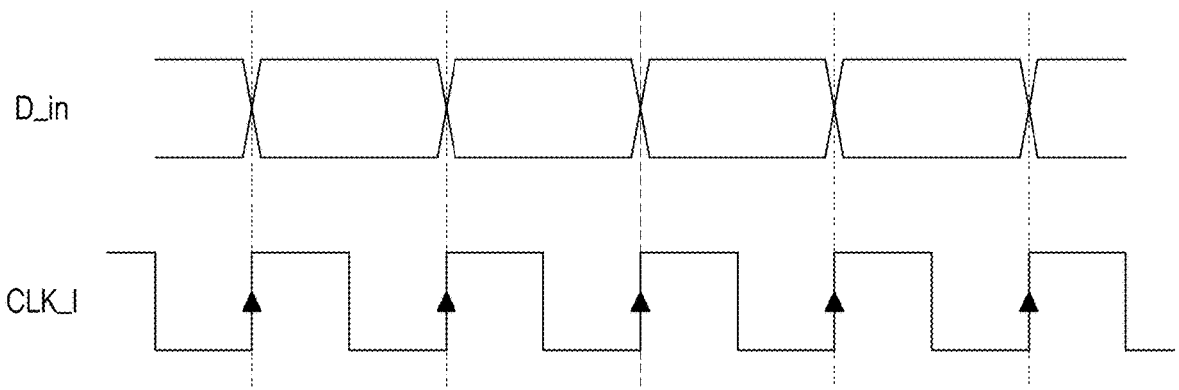
FIGS. 3A and 3B are diagrams showing input data and a reference clock signal when a phase and frequency detector operates at full-rate and half-rate, respectively, according to an embodiment.
Figure 3B:
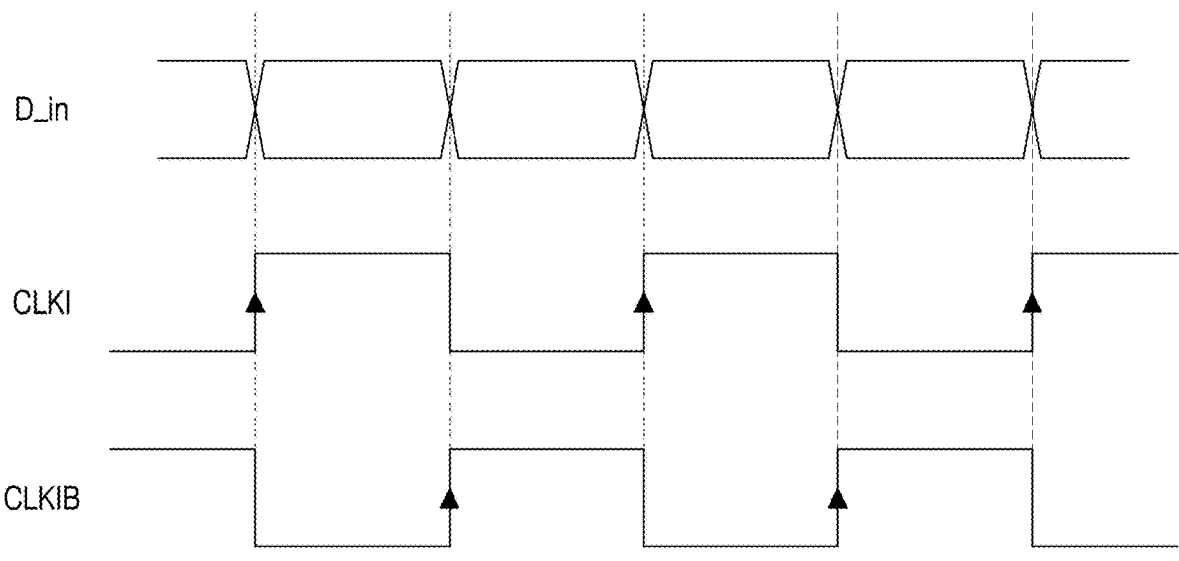

FIGS. 3A and 3B are diagrams showing input data and a reference clock signal when a phase and frequency detector operates at full-rate and half-rate, respectively, according to an embodiment.

For example, FIG. 3A shows a case in which the phase and frequency detector 100 operates at full-rate. That is, the reference clock signal CLK_r of FIG. 3A may operate based on full-rate, and may be set to operate at the same cycle as a frequency of the input data D_in. In other words, the rising edge of the reference clock signal CLK_r is aligned with the same phase of the input data D_in, and thus the phase and frequency detector 100 may capture the input data D_in at regular intervals.

FIG. 3B shows a case in which the phase and frequency detector 100 operates at half-rate. That is, the reference clock signal CLK_r of FIG. 3B may operate based on half-rate, and the reference clock signal CLK_r may include a first clock signal CLK1 and a second clock signal CLK2. The reference clock signal CLK_r may be set to operate at a cycle twice a frequency of the input data D_in. In other words, the rising edges of the first clock signal CLK1 and the second clock signal CLK2 are alternately aligned with the same phase of the input data D_in, and thus the phase and frequency detector 100 may capture the input data D_in every certain time.

A plurality of clock signals may be generated at full-rate, half-rate, quarter-rate, and higher rates in relation to the input data D_in. The rates may have technical differences in how many clocks are used to cover input data, but may be equally applied in a method used to detect a frequency and a phase. The following drawings illustrate phases of a clock signal and data based on half-rate for convenience of explanation, but the inventive concept is not limited to half-rate.

Figure 4:
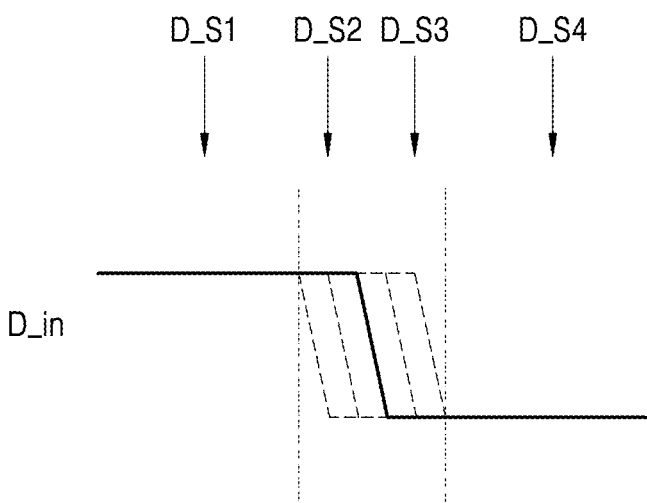
FIG. 4 is a diagram showing data distortion, according to an embodiment.

FIG. 4 is a diagram showing data distortion, according to an embodiment.

Referring to FIG. 4, temporal distortion may occur due to jitter and skew in the input data D_in. Skew may refer to a temporal difference in data caused by internal factors of each device, such as flipflops, or external factors, such as temperature changes, and jitter may refer to a temporal difference that may occur every cycle of a signal that needs to periodically operate depending on internal/external factors.

Data distortion may occur in the input data D_in, and when data sampling, that is, data capture based on a clock signal, is performed within the distortion range, phase shifted data D_S2 and D_S3 within the distortion range may be affected by data distortion. For example, when ideal input data D_in is reached, the phase shifted data D_S2 and the phase shifted data D_S3 may capture a first logic level (e.g., '1') and a second logic level (e.g., '0'), respectively. However, data distortion may occur in the input data D_in, and accordingly, the phase shifted data D_S2 and D_S3 within the distortion range may capture different values.

On the other hand, when data capture is made according to a clock signal outside the distortion range, the phase shifted data D_S1 and D_S4 may read the input data D_in regardless of data distortion. Therefore, stable frequency detection may be performed despite data distortion by sampling, as a target, a position rather than a boundary between signals of data.

A method of capturing data at a boundary between signals of data, that is, an edge of the input data D_in, may be affected by distortion of the input data D_in, which will be described with reference to FIGS. 5A to 5C.

Figure 5A:
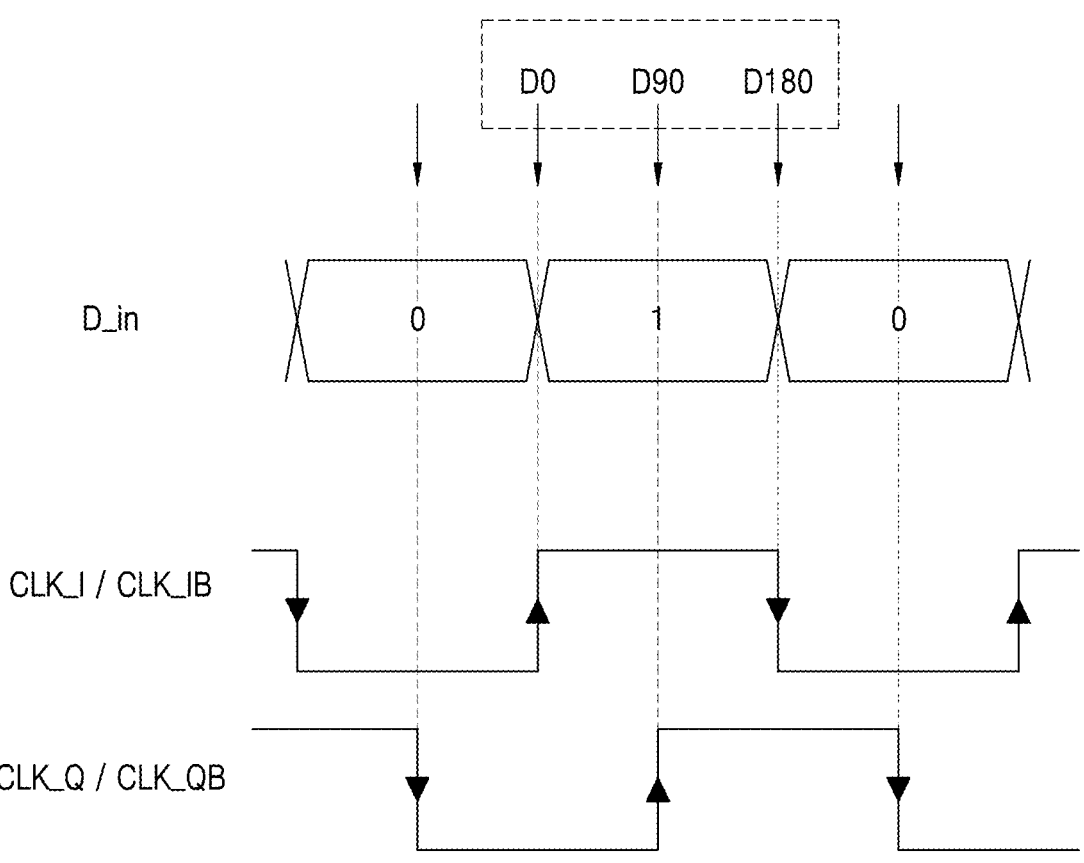
FIGS. 5A to 5C are diagrams showing detection errors of a phase and frequency detector due to data distortion, according to a comparative example.
Figure 5B:
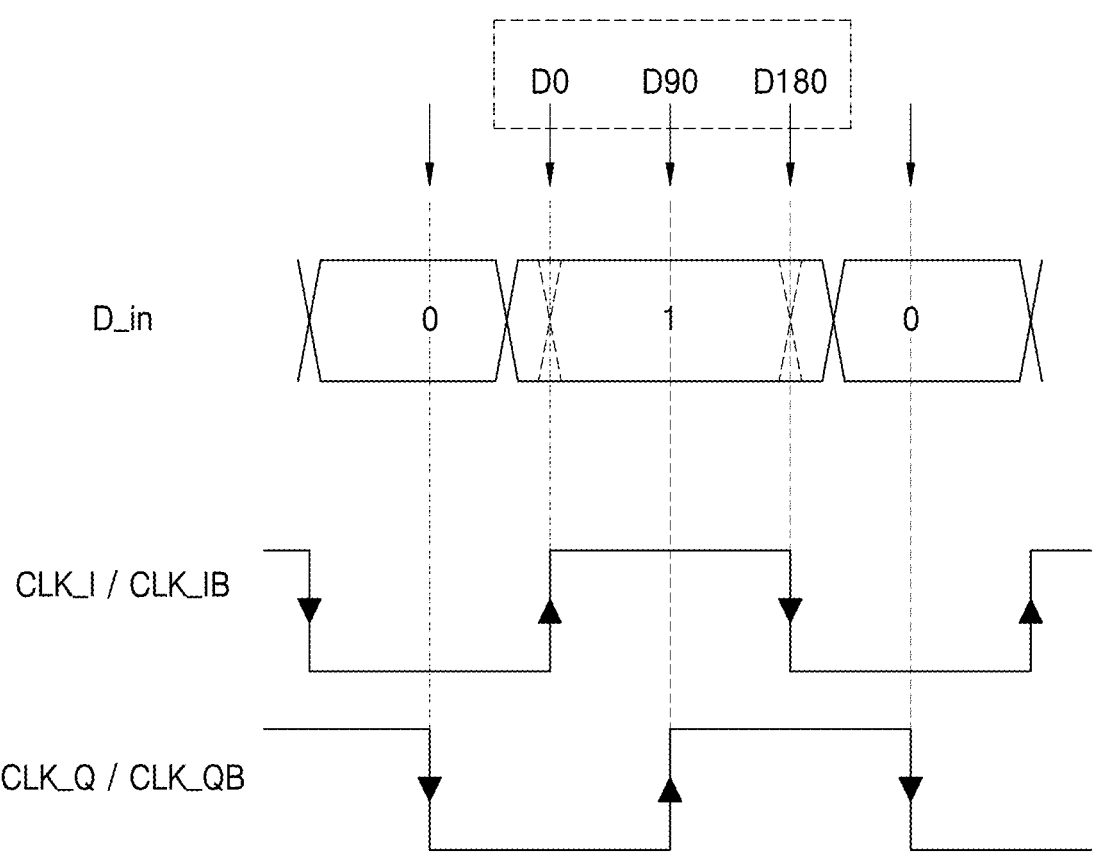
Figure 5C:
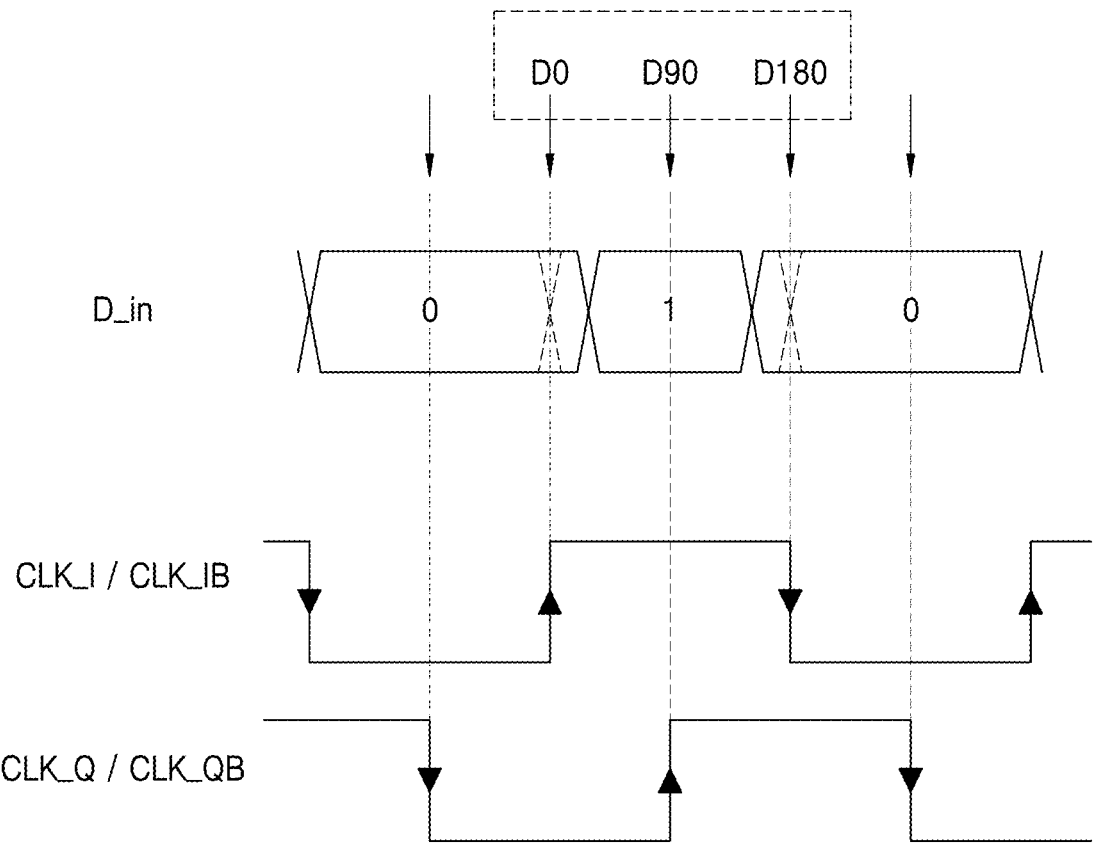

FIGS. 5A to 5C are diagrams showing detection errors of a phase and frequency detector due to data distortion, according to a comparative example.

FIGS. 5A to 5C show cases in which the input data D_in is captured at about 0 degrees, about 90 degrees, and about 180 degrees. For convenience of explanation, the input data D_in in FIGS. 5A to 5C is illustrated as representing '010', and repeated descriptions of FIG. 4 are omitted.

FIG. 5A shows detection assuming that there is no distortion of the input data D_in. When capturing the input data D_in at about 0, about 90, and about 180 degrees, the phase and frequency detector 100 may normally read the input data D_in and normally perform phase and frequency detection. Frequency comparison may be recognized normally by respectively positioning the data boundary and data center of the input data D_in at positions of about 0, about 90, and about 180 degrees of the clock signal.

On the other hand, FIGS. 5B to 5C show a case in which distortion occurs in the input data D_in. Referring to FIG. 5B, as distortion of the input data D_in occurs, the phase and frequency detector 100 may recognize the input data D_in as '111' when capturing the input data D_in at 0 about degrees, about 90 degrees, and about 180 degrees. In other words, data capture at a boundary between signals may be affected by data distortion, which may cause problems in generating data for the frequency control signal.

Referring to FIG. 5C, as distortion of the input data D_in occurs, the phase and frequency detector 100 may recognize the input data D_in as '010' when capturing the input data D_in at about 0 degrees, about 90 degrees, and about 180 degrees. As distortion of the input data D_in occurs, data capture at a boundary between data signals is not performed, and thus the phase and frequency detector 100 may incorrectly determine that the reference clock signal is fast. Therefore, stable frequency detection may be performed despite data distortion by sampling, as a target, a position rather than a boundary between data signals.

A frequency of the input data D_in in a wide range may not differ between FIGS. 5A to 5C. However, as distortion of the input data D_in occurs locally, the phase and frequency detector 100 may incorrectly determine that the reference clock signal is slow in the case of FIG. 5B and that the reference clock signal is fast in the case of FIG. 5C. Therefore, capturing the input data D_in may be performed in a phase spectrum region larger than a cycle of the reference clock signal.

Figure 6:
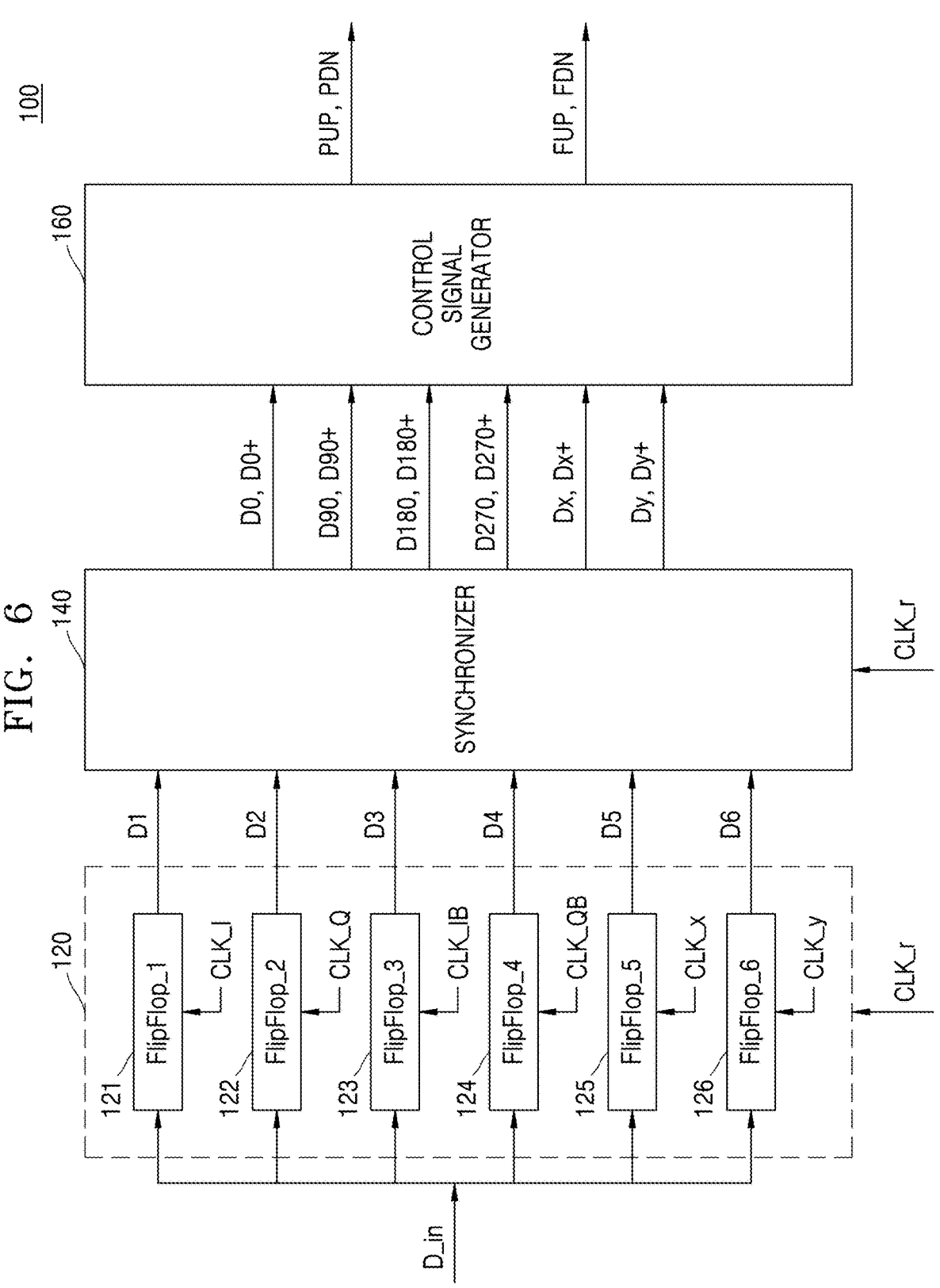
FIG. 6 is a block diagram showing a phase and frequency detector, according to an embodiment.

FIG. 6 is a block diagram showing the phase and frequency detector 100, according to an embodiment.

Referring to FIG. 6, the phase and frequency detector 100 may include the phase shifted data generator 120, the synchronizer 140, and the control signal generator 160. For convenience of explanation, repeated descriptions of the phase and frequency detector 100 of FIGS. 1 and 2 are omitted, and FIG. 6 is described below with reference to FIGS. 1 and 2.

The phase shifted data generator 120 may include a plurality of flip-flops. For example, the phase shift data generator 120 includes a first flip-flop 121, a second flip-flop 122, a third flip-flop 123, a fourth flip-flop 124, a fifth flip-flop 125, and a sixth flip-flop 126. In an embodiment, the first flip-flop 121 may generate first data D1 from the input data D_in by using a clock signal CLK_I. The clock signal CLK_I may be a clock signal having the same phase as the reference clock signal CLK_r. In an embodiment, the second flip-flop 122 may generate second data D2 from the input data D_in by using a clock signal CLK_Q. The clock signal CLK_Q may be a clock signal having a phase difference of about 90 degrees with respect to the reference clock signal CLK_r. In an embodiment, the third flip-flop 123 may generate third data D3 from the input data D_in by using a clock signal CLK_IB. The clock signal CLK_IB may be an inverted clock signal CLK_I, and may be a clock signal with a phase difference of about 180 degrees ($\pi$) with respect to the clock signal CLK_I. In an embodiment, the fourth flip-flop 124 may generate fourth data D4 from the input data D_in by using a clock signal CLK_QB. The clock signal CLK_QB may be an inverted clock signal CLK_Q, and may be a clock signal with a phase difference of about 180 degrees ( ) with respect to the clock signal CLK_Q.

In an embodiment, the fifth flip-flop 125 may generate fifth data D5 from the input data D_in by using a clock signal CLK_x. In an embodiment, the sixth flip-flop 126 may generate sixth data D6 from the input data D_in by using a clock signal CLK_y. The clock signal CLK_x may be a clock signal having a certain phase difference from the reference clock signal CLK_r. The clock signal CLK_y may be a clock signal having a certain phase difference from the reference clock signal CLK_r. FIG. 6 is a diagram based on half-rate, and the clock signal CLK_x and clock signal CLK_y according to an embodiment may have a phase difference less than about 90 degrees with respect to the reference clock signal CLK_r.

The phase shifted data generator 120 may receive a plurality of clock signals including a reference clock signal and at least one phase shifted clock signal having a phase difference of a predetermined interval with respect to the reference clock signal, and generate a plurality of phase shifted data. For example, as illustrated in FIG. 6, the phase shifted data generator 120 may receive a plurality of clock signals including the clock signal CLK_I corresponding to the reference clock signal and at least one phase shifted clock signal CLK_Q, CLK_IB, CLK_QB, CLK_x, and CLK_y having a phase difference of a predetermined interval with respect to the reference clock signal, and generate a plurality of phase shifted data.

The phase shifted data generator 120 may include different numbers of flip-flops. When the phase and frequency detector 100 operates at full rate, the number of flip-flops and a phase difference of the clock signal from the reference clock signal may be changed. When the phase and frequency detector 100 operates at full-rate, a phase difference from the reference clock signal may be twice that in the case in which the phase and frequency detector 100 operates at half-rate. For example, when the phase and frequency detector 100 operates at full-rate, the clock signal CLK_x and the clock signal CLK_y according to an embodiment may have a phase difference less than about 180 degrees with respect to the reference clock signal CLK_r.

Figure 7A:
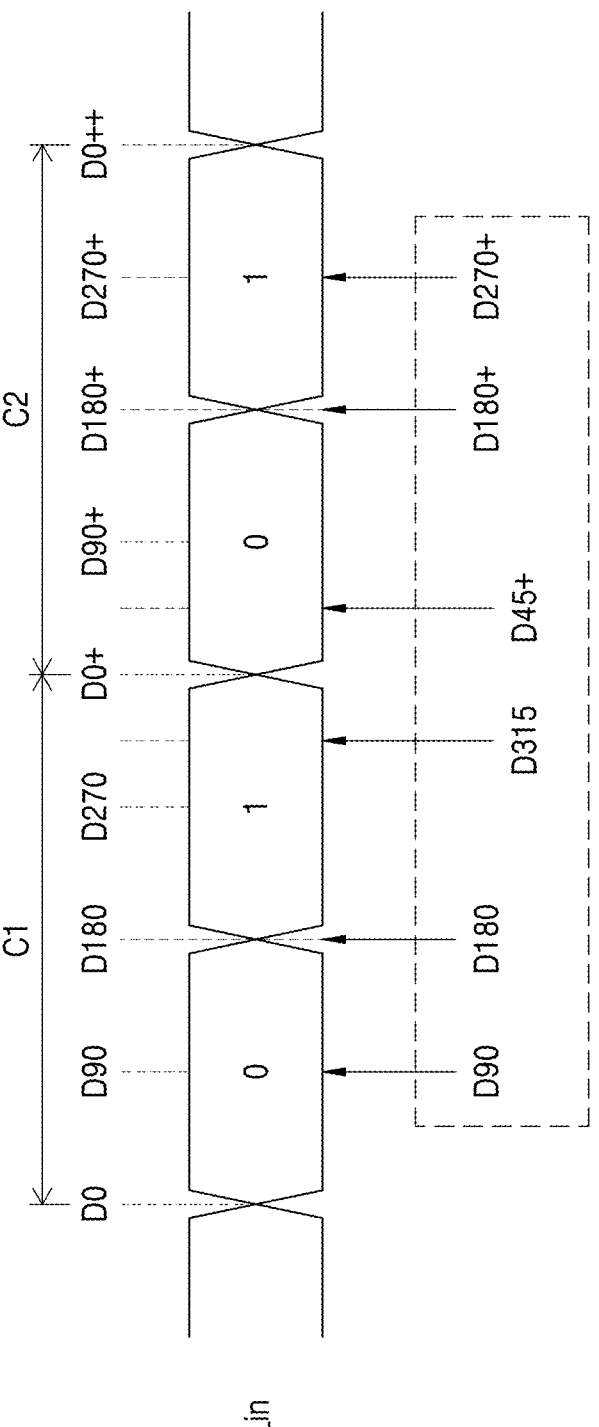
Figure 7B:
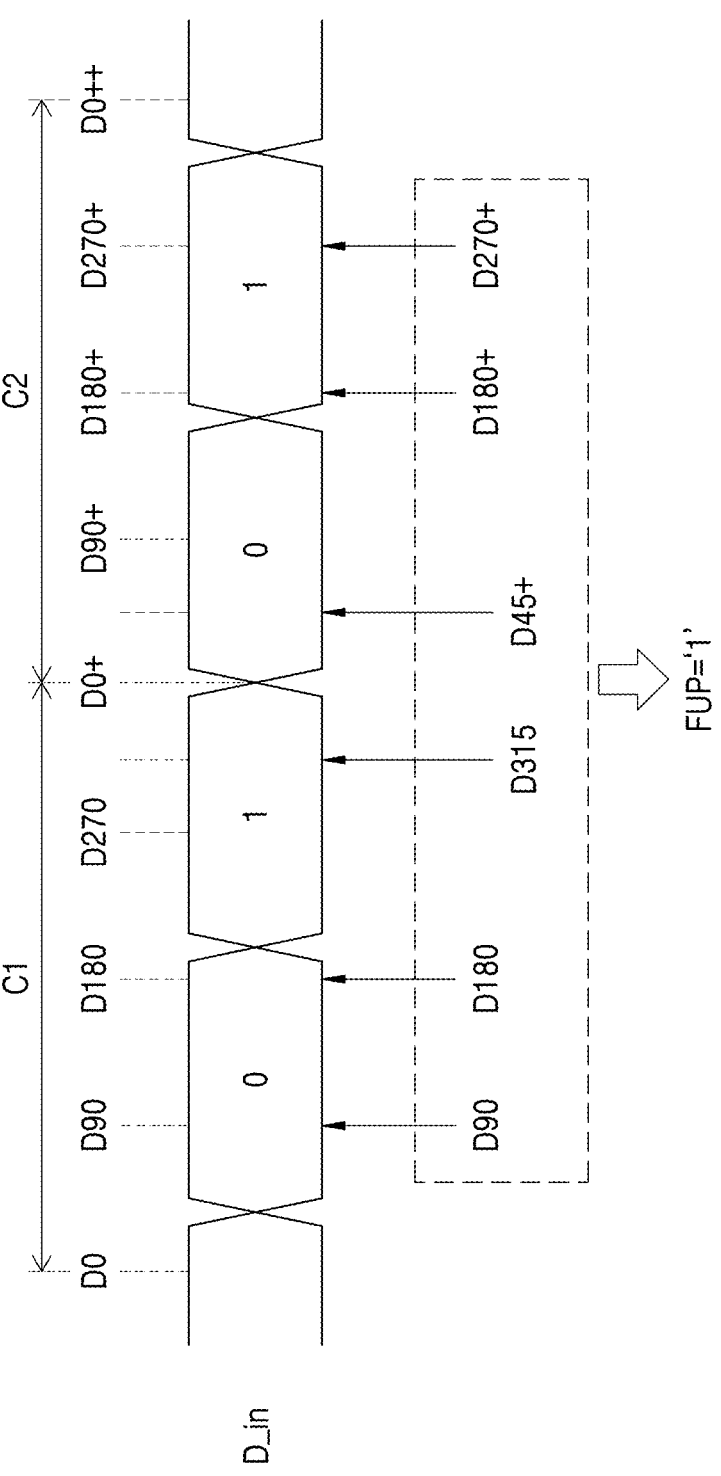
Figure 7C:
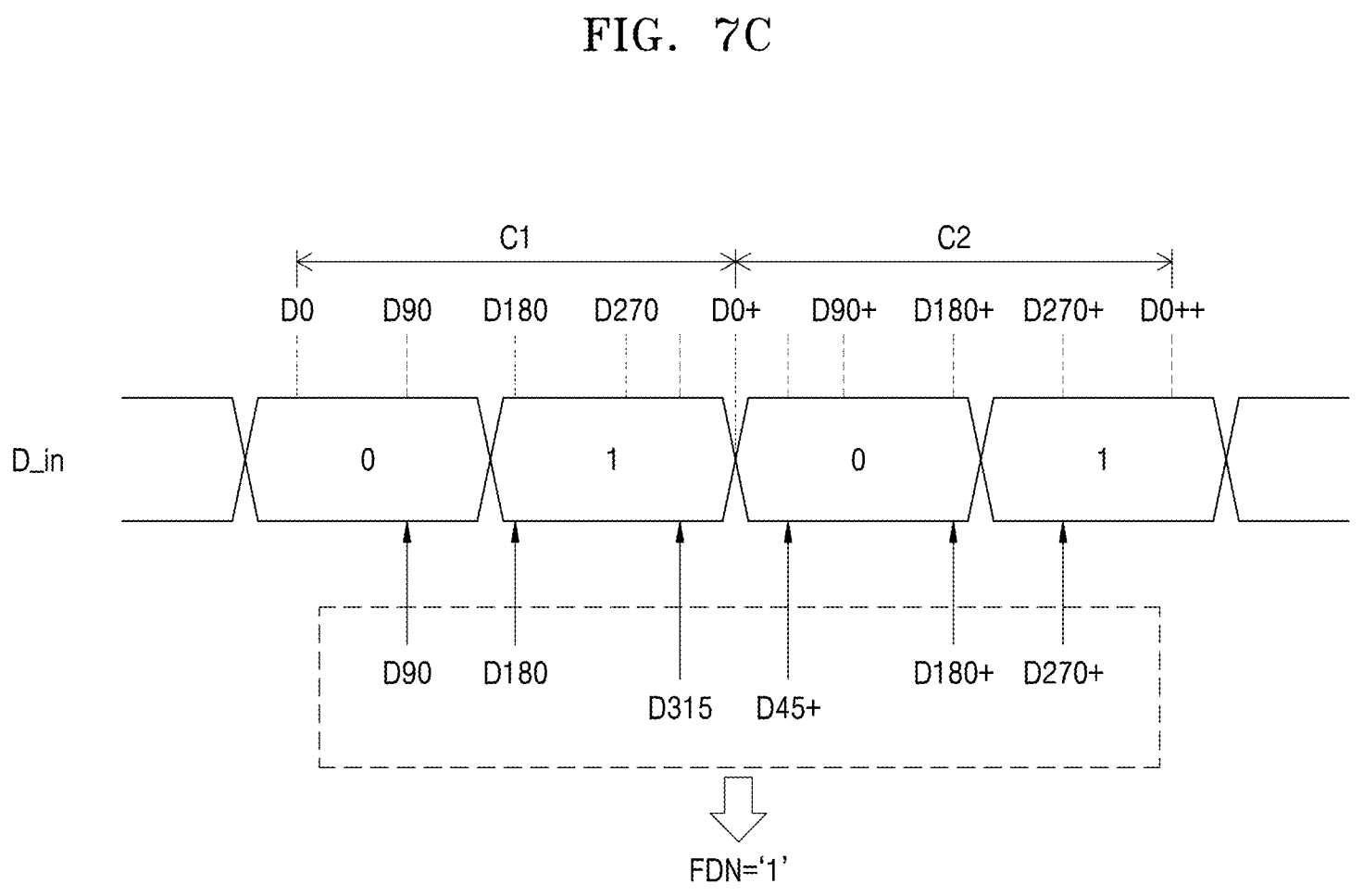

FIGS. 7A to 7C are diagrams showing a frequency detection method of the phase and frequency detector 100, according to an embodiment.

For convenience of explanation, FIGS. 7A to 7C illustrate an example in which the clock signal CLK_x and the clock signal CLK_y of FIG. 6 are a clock signal CLK45 and a clock signal CLK315, respectively. The drawings show an example in which the phase and frequency detector 100 operates at half-rate, and when operating at different rates, for example, when operating at full-rate, the phase and frequency detector 100 may have a phase difference appropriate for the corresponding rate. For convenience of explanation, the input data D_in in FIGS. 7A to 7C is illustrated as representing '0101'. Hereinafter, FIGS. 7A to 7C are described with reference to the above-described embodiments, and repeated descriptions of the above description are omitted.

Referring to FIG. 7A, the phase and frequency detector 100 may generate a frequency control signal based on data D90, D180, D315, D45+, D180+, and D270+ that are captured and then synchronized based on a plurality of clock signals. The data D45+, D180+, and D270+ may mean data different by one cycle from the data D45+, D180+, and D270+, respectively. That is, a phase spectrum of a plurality of synchronization data on which a logical operation for generating a frequency control signal is based by the phase and frequency detector 100, may be formed to be greater than a signal cycle of a reference clock signal. In other words, a phase interval between the two data having the largest phase difference from among the plurality of synchronization data may be greater than a signal cycle of the reference clock signal. As seen from the drawings illustrated in FIGS. 7A to 7C, a phase spectrum of a plurality of synchronization data on which a logical operation for generating the frequency control signal is based may be formed over two cycles C1 and C2.

The plurality of synchronized data D90, D180, D315, D45+, D180+, and D270+ may be data generated based on at least one unequal phase shifted data. The unequal phase shifted data may be data formed by sampling, as a target, a position rather than a boundary between signals of the input data D_in. For example, the synchronized data D90, D315, D45+, and D270+ may be data formed by sampling, as a target, a position rather than a boundary between signals of the input data D_in. In this regard, repeated descriptions of FIG. 4 are omitted.

Referring to FIG. 7B, a frequency of the reference clock signal CLK_r may be less than a frequency of the input data D_in. The phase and frequency detector 100 may generate the frequency control signal based on data D90, D180, D315, D45+, D180+, and D270+ that are captured and then synchronized based on a plurality of clock signals. For example, when data has a value of '001011' or '110100', the phase and frequency detector 100 may determine that the frequency of the reference clock signal CLK_r is less than the frequency of the input data D_in. When determining that the frequency of the reference clock signal CLK_r is less than the frequency of the input data D_in, the phase and frequency detector 100 may output the frequency up signal FUP of the first logic level (e.g., '1').

Referring to FIG. 7C, the frequency of the reference clock signal CLK_r may be greater than the frequency of the input data D_in. The phase and frequency detector 100 may generate the frequency control signal based on data D90, D180, D315, D45+, D180+, and D270+ that are captured and then synchronized based on a plurality of clock signals. For example, when data has a value of '011001' or '100110', the phase and frequency detector 100 may determine that the frequency of the reference clock signal CLK_r is greater than the frequency of the input data D_in. When determining that the frequency of the reference clock signal CLK_r is greater than the frequency of the input data D_in, the phase and frequency detector 100 may output the frequency down signal FDN of the first logic level (e.g., '1').

Stable frequency detection may be performed despite data distortion by sampling, as a target, a position rather than a boundary between signals of data. More stable frequency control is possible by capturing the input data D_in in a phase spectrum region larger than a cycle of the reference clock signal.

According to an embodiment as described above, the phase and frequency detector 100 may stably detect a phase and a frequency despite distortions such as skew and jitter of data. According to an embodiment as described above, the clock and data recovery circuit 10 may track frequency errors without a separate frequency locking loop and may quickly find a target frequency, thereby simplifying the overall system structure.

Figure 8A:
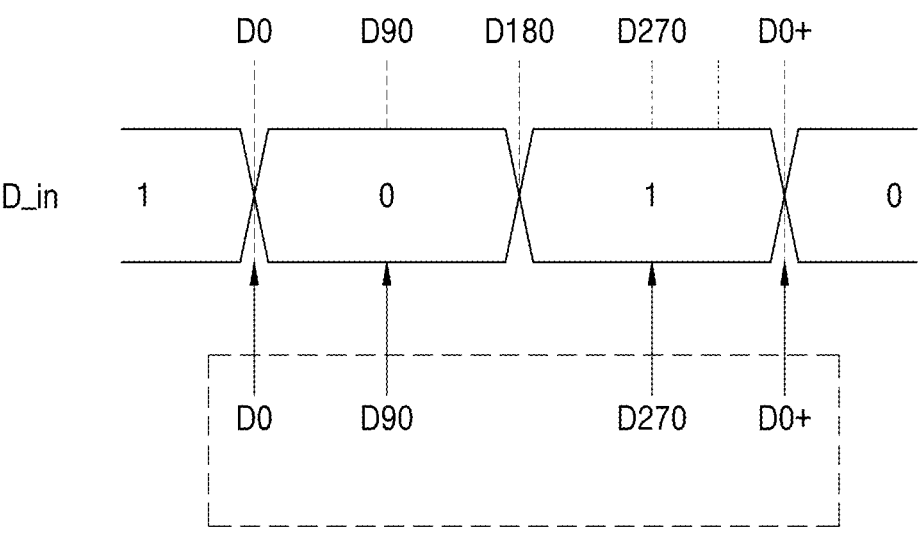
FIGS. 8A to 8C are diagrams showing a frequency detection method of a phase and frequency detector, according to an embodiment.
Figure 8B:
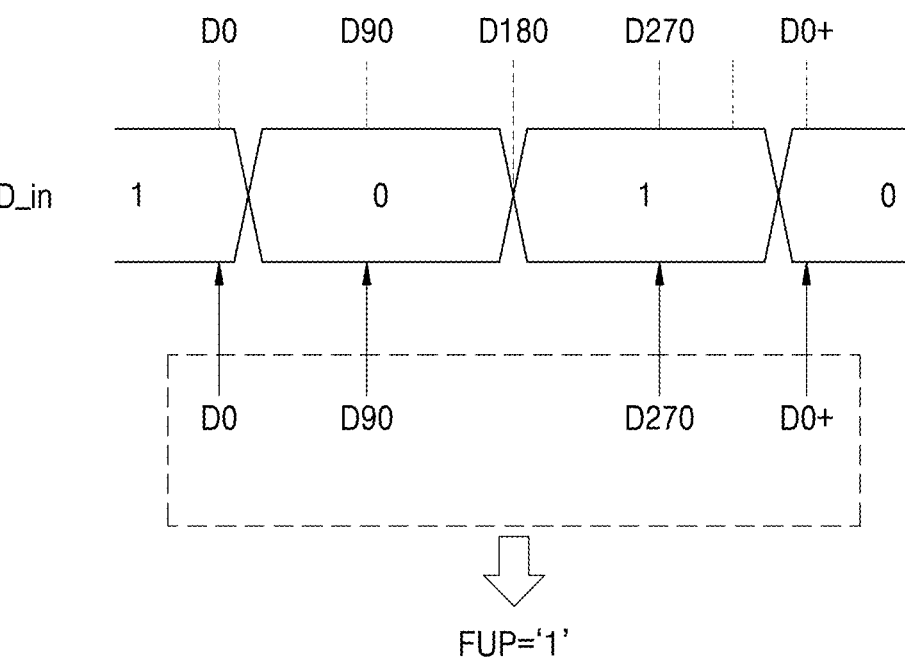
Figure 8C:
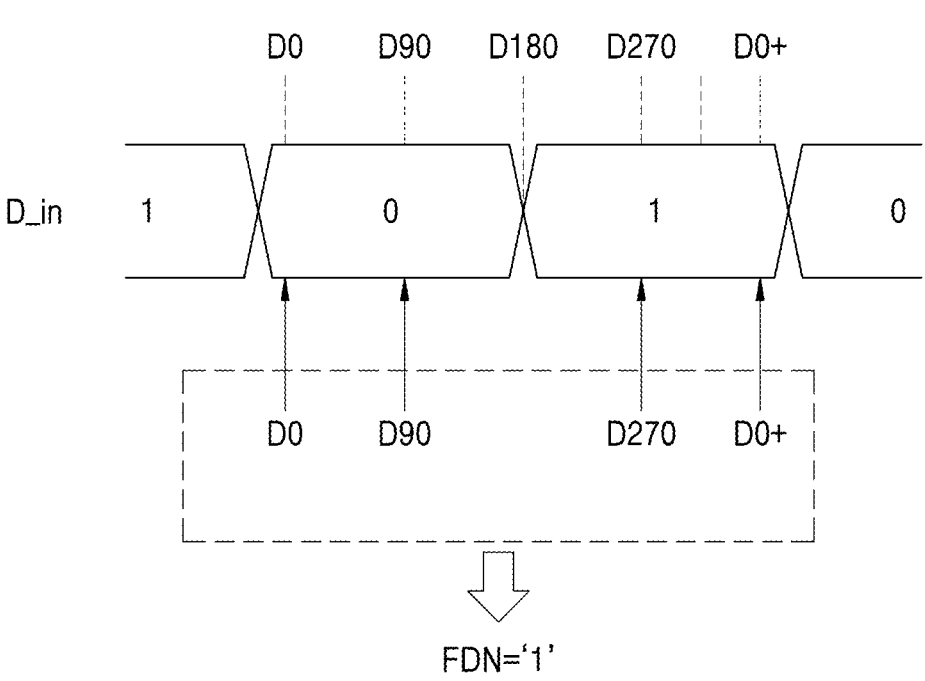

FIGS. 8A to 8C are diagrams showing a frequency detection method of a phase and frequency detector, according to an embodiment.

For convenience of explanation, FIGS. 8A to 8C show an example in which the phase and frequency detector 100 operates at half-rate, and when operating at different rates, such as when operating at full-rate, the phase and frequency detector 100 may have a phase difference appropriate for the corresponding rate. For convenience of explanation, the input data D_in in FIGS. 8A to 8C is illustrated as representing '1010'. Hereinafter, FIGS. 8A to 8C are described with reference to the above-described embodiments, and repeated descriptions of the above description are omitted.

Referring to FIG. 8A, the phase and frequency detector 100 may generate the frequency control signal based on data D0, D90, D270, and D0+ that are captured and then synchronized based on a plurality of clock signals. The plurality of synchronized data D0, D90, D270, and D0+ may be data generated based on at least one unequal phase shifted data. The unequal phase shifted data may be data formed by sampling, as a target, a position rather than a boundary between signals of the input data D_in. For example, the synchronized data D90 and D270 may be data formed by sampling, as a target, a position rather than a boundary between signals of the input data D_in. In this regard, repeated descriptions of FIG. 4 are omitted.

Referring to FIG. 8B, a frequency of the reference clock signal CLK_r may be less than a frequency of the input data D_in. The phase and frequency detector 100 may generate the frequency control signal based on data D0, D90, D270, and D0+ that are captured and then synchronized based on a plurality of clock signals. For example, when data has a value of '1010' or '0101', the phase and frequency detector 100 may determine that the frequency of the reference clock signal CLK_r is less than the frequency of the input data D_in. When determining that the frequency of the reference clock signal CLK_r is less than the frequency of the input data D_in, the phase and frequency detector 100 may output the frequency up signal FUP of the first logic level (e.g., '1').

Referring to FIG. 8C, a frequency of the reference clock signal CLK_r may be greater than a frequency of the input data D_in. The phase and frequency detector 100 may generate the frequency control signal based on data D0, D90, D270, and D0+ that are captured and then synchronized based on a plurality of clock signals. For example, when data has a value of '0011' or '1100', the phase and frequency detector 100 may determine that the frequency of the reference clock signal CLK_r is greater than the frequency of the input data D_in. When determining that the frequency of the reference clock signal CLK_r is greater than the frequency of the input data D_in, the phase and frequency detector 100 may output the frequency down signal FDN of the first logic level (e.g., '1').

Stable frequency detection may be performed despite data distortion by sampling, as a target, a position rather than a boundary between signals of data. More stable frequency control is possible by capturing the input data D_in in a phase spectrum region larger than a cycle of the reference clock signal.

According to an embodiment as described above, the phase and frequency detector 100 may stably detect a phase and a frequency despite distortions such as skew and jitter of data. According to an embodiment as described above, the clock and data recovery circuit 10 may track frequency errors without a separate frequency locking loop and may quickly find a target frequency, thereby simplifying the overall system structure.

FIGS. 9A to 9E are diagrams showing a phase detection method of a phase and frequency detector, according to an embodiment.

For convenience of explanation, FIGS. 9A to 9E show an example in which the phase and frequency detector 100 operates at half-rate, and when operating at different rates, such as when operating at full-rate, the phase and frequency detector 100 may have a phase difference appropriate for the corresponding rate. For convenience of explanation, the input data D_in in FIGS. 9A to 9E is illustrated as representing '1010'. Hereinafter, FIGS. 9A to 9E will be described with reference to the above-described embodiments, and repeated descriptions of the above description will be omitted.

Figure 9A:
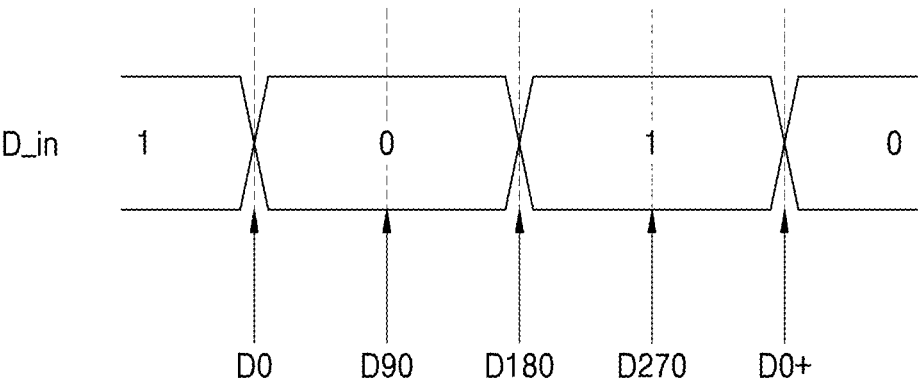
FIGS. 9A to 9E are diagrams showing a phase detection method of a phase and frequency detector, according to an embodiment.

FIG. 9A shows a case in which a phase of the reference clock signal CLK_r is the same as a phase of the input data D_in. Data captured by the synchronizer 140 may be data D0, D90, D180, D270, and D0+. Data D90 and data D270 of the data captured by the synchronizer 140 may be aligned at the center of a data window of the input data D_in. Data D0, data D180, and data D0+ of the data captured by the synchronizer 140 may be aligned at an edge of the input data D_in.

Figure 9B:
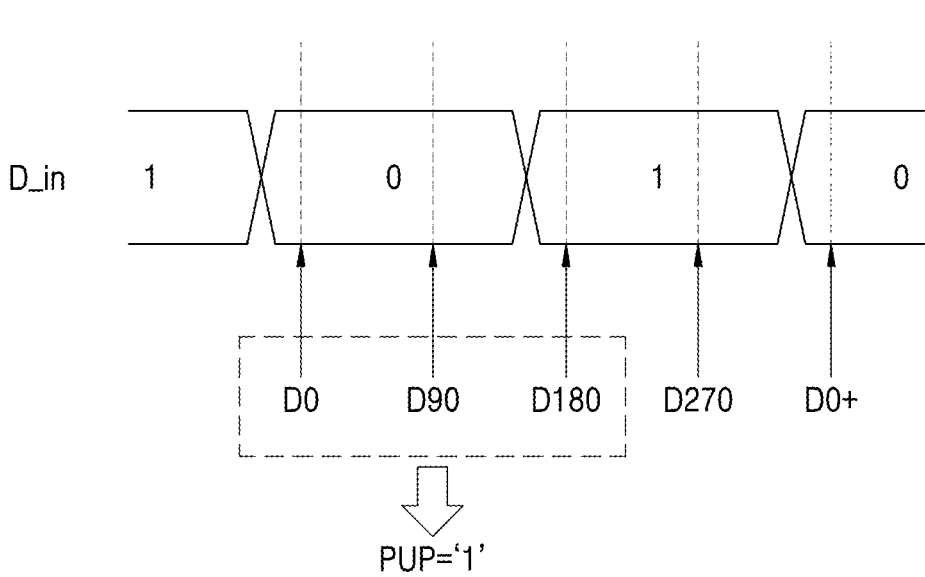
Figure 9C:
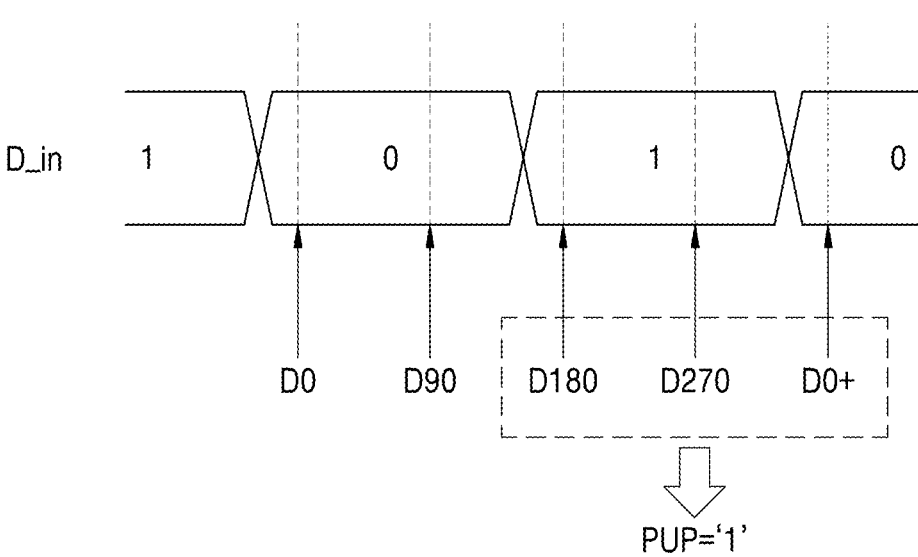

On the other hand, FIGS. 9B and 9C show a case in which a phase of the reference clock signal CLK_r is later than a phase of the input data. Referring to FIGS. 9B and 9C, data captured by the synchronizer 140 may be the data D0, D90, D180, D270, and D0+. The phase of the reference clock signal CLK_r is later than the phase of the input data D_in, and thus the data captured by the synchronizer 140 may also have a phase later than the input data D_in. As shown in FIG. 9B, when data has a value of '001' or '110' based on data D0, D90, and D180, the control signal generator 160 may output a phase pull signal PUP of a first logic level (e.g., '1'). As shown in FIG. 9C, when data has a value of '001' or '110' based on data D180, D270, and D0+, the control signal generator 160 may output a phase pull signal PUP of a first logic level (e.g., '1'). As such, when the phase of the reference clock signal CLK_r is later than the phase of the input data D_in, the phase and frequency detector 100 may output the phase pull signal PUP of the first logic level, and thus the clock and data recovery circuit 10 may pull the phase of the reference clock signal CLK_r, thereby normalizing an operation of the system.

Figure 9D:
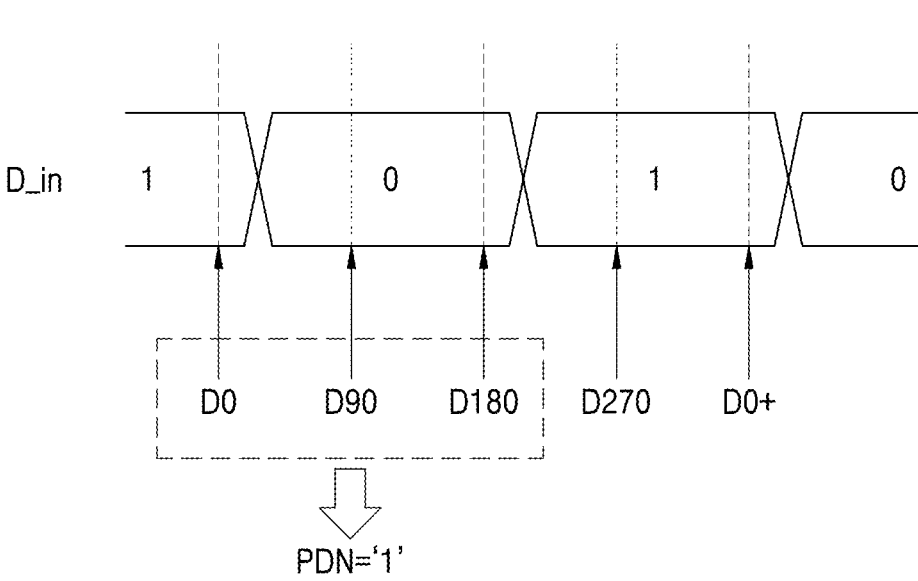
Figure 9E:
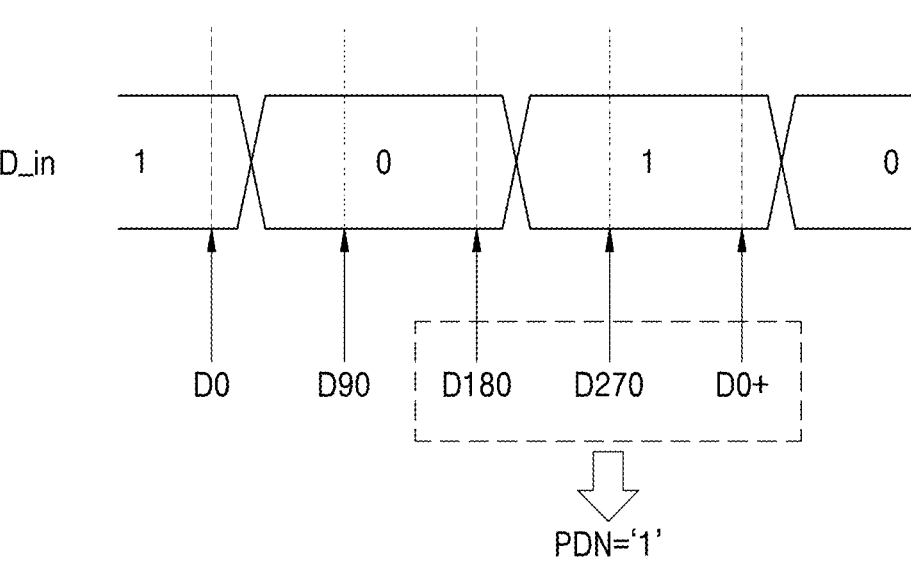

FIGS. 9D and 9E show a case in which a phase of the reference clock signal CLK_r is earlier than a phase of the input data. Referring to FIGS. 9D and 9E, data captured by the synchronizer 140 may be the data D0, D90, D180, D270, and D0+. The phase of the reference clock signal CLK_r is earlier than the phase of the input data D_in, and thus the data captured by the synchronizer 140 may also have a phase earlier than the input data D_in. As shown in FIG. 9D, when data has a value of '100' or '011' based on data D0, D90, and D180, the control signal generator 160 may output a phase delay signal PDN of a first logic level (e.g., '1'). As shown in FIG. 9E, when data has a value of '011' or '100' based on data D180, D270, and D0+, the control signal generator 160 may output a phase delay signal PDN of a first logic level (e.g., '1'). As such, when the phase of the reference clock signal CLK_r is earlier than the phase of the input data D_in, the phase and frequency detector 100 may output the phase delay signal PDN of the first logic level, and thus the clock and data recovery circuit 10 may delay the phase of the reference clock signal CLK_r, thereby normalizing an operation of the system.

Figure 10:
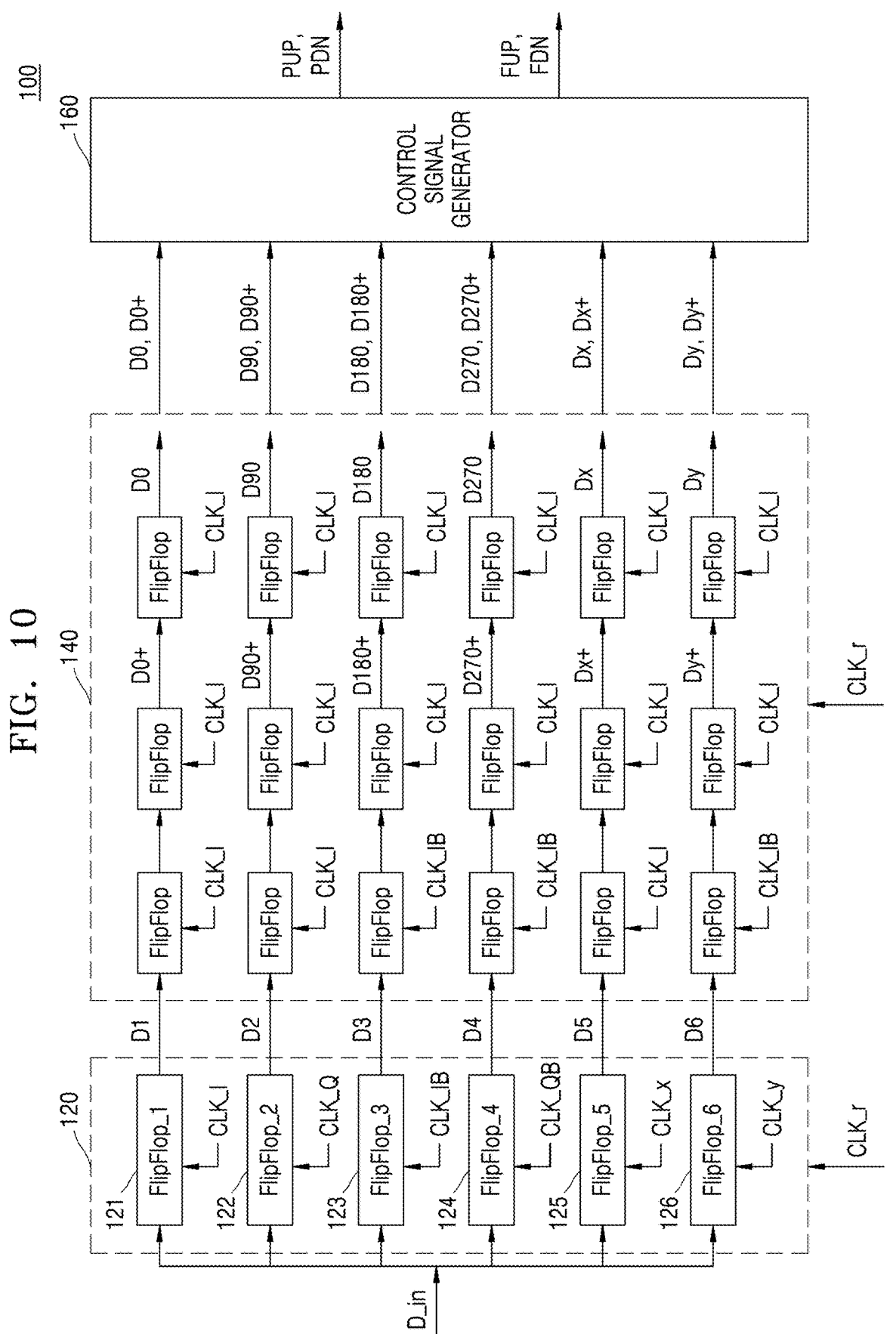
FIG. 10 is a block diagram showing a phase and frequency detector, according to an embodiment.

FIG. 10 is a block diagram showing a phase and frequency detector, according to an embodiment.

Referring to FIG. 10, the phase and frequency detector 100 may include the phase shifted data generator 120, the synchronizer 140, and the control signal generator 160. Repeated descriptions of the phase and frequency detector

100 of FIGS. 1, 2, and 6 are omitted, and FIG. 10 is described below with reference to FIGS. 1, 2, and 6.

The phase shifted data generator 120 may include a plurality of flip-flops. For example, the phase shifted data generator 120 may include the first flip-flop 121, the second flip-flop 122, the third flip-flop 123, the fourth flip-flop 124, the fifth flip-flop 125, and the sixth flip-flop 126. For convenience of explanation, FIG. 10 shows an example in which the clock signal CLK_I is a clock signal having the same phase as the reference clock signal CLK_r, the clock signal CLK_Q is a clock signal having a phase difference of about 90 degrees with respect to the reference clock signal CLK_r, the clock signal CLK_IB is an inverted clock signal CLK_I and has a phase difference of about 180 degrees ($\pi$) with respect to the clock signal CLK_I, and the clock signal CLK_QB is an inverted clock signal CLK_Q and is a clock signal having a phase difference of about 180 degrees ($\pi$) with respect to the clock signal CLK_Q. For convenience of explanation, an example in which the clock signal CLK_x and the clock signal CLK_y are each a clock signal having a certain phase difference from the reference clock signal CLK_r is described.

The synchronizer 140 may include a plurality of flip-flops. For example, the first data D1 output from the first flip-flop 121 may be output through three flip-flops. All three flip-flops through which the first data D1 passes may operate based on the reference clock signal CLK_I. Based on a certain time, the phase of the first data D1 may change as the first data D1 passes through the flip-flops. For example, the first data D1 may be sequentially represented as data D0++, data D0+, and data D0 as the first data D1 passes through the flip-flops.

The data D0 refers to data, a reference phase of which is 0. The data D0+ refers to data having a phase difference of 360 about degrees ($2\pi$) with respect to the data D0, and the data D0++ refers to data having a phase difference of about 360 degrees ($2\pi$) with respect to the data D0+. In other words, the data D0++ means data having a phase difference of about 720 degrees ($4\pi$) with respect to the data D0. Similarly, data D90 refers to data having a phase difference of about 90 degrees ($\pi/2$) with respect to the data D0, and data D90+ refers to data having a phase difference of about 360 degrees ($2\pi$) with respect to the data D90. In other words, the data D90+ means data having a phase difference of about 450 degrees ($5\pi/2$) with respect to the data D0.

Similarly, third data D_3 output from the third flip-flop 123 may be output through three flip-flops. Each of the three flip-flops through which the inverted first data D_3 passes may operate based on the clock signal CLK_IB, the reference clock signal CLK_I, and the reference clock signal CLK_I. Based on a certain time, the phase of the third data D_3 may change as the third data D_3 passes through the flip-flops. For example, the inverted first data D_3 may be sequentially represented as data D180++, data D180+, and data D180 as the inverted first data D_3 passes through the flip-flops.

Data output from the second flip-flop 122 and the fourth flip-flop 124 may also be synchronized in the same manner.

As a result, the synchronizer 140 may output data D0, D0+, D90, D90+, D180, D180+, D270, D270+, DX, DX+, DY, and DY+ synchronized with equally divided clock signals. According to an embodiment as described above, the phase and frequency detector 100 may stably detect a phase and a frequency despite distortions such as skew and jitter of data. According to an embodiment as described above, the clock and data recovery circuit 10 may track frequency errors without a separate frequency locking loop and may quickly find a target frequency, thereby simplifying the overall system structure.

Figure 11:
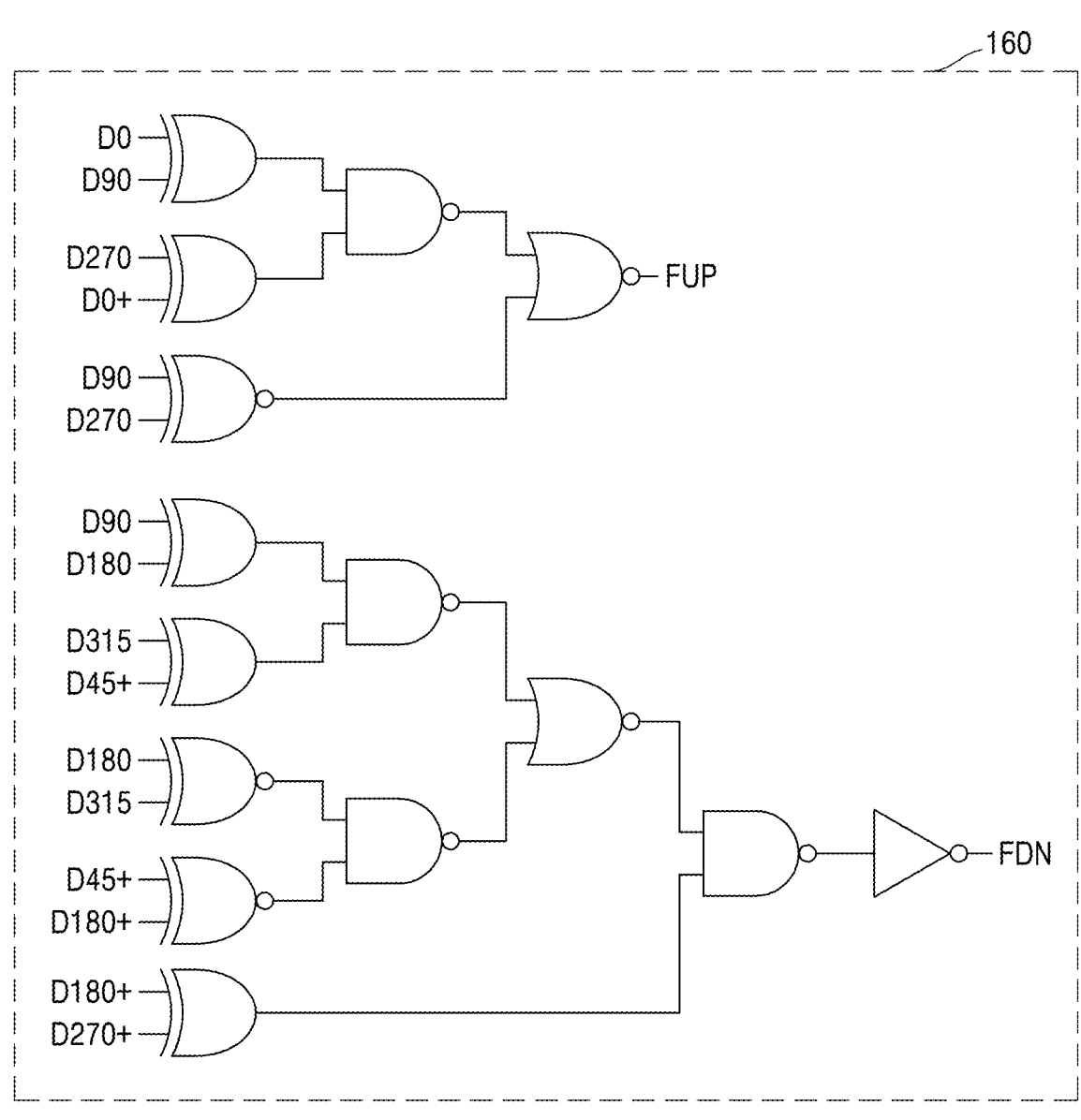
FIG. 11 is a block diagram showing a control signal generator, according to an embodiment.

FIG. 11 is a block diagram showing a control signal generator, according to an embodiment.

Referring to FIG. 11, the control signal generator 160 may include a plurality of logical operators. It is noted that FIG. 11 is exemplary illustration and is not limited to an illustrated logic circuit alone. Hereinafter, FIG. 11 is described with reference to the above-described embodiments, and repeated descriptions of the above description are omitted.

For example, the control signal generator 160 may include at least one OR operator, at least one NOR operator, and at least one AND operator. The control signal generator 160 may generate a phase control signal and a frequency control signal through a plurality of logical operators. The phase control signal may include a phase pull signal PUP and a phase delay signal PDN. The frequency control signal may include a frequency up signal FUP and a frequency down signal FDN.

Figure 12:
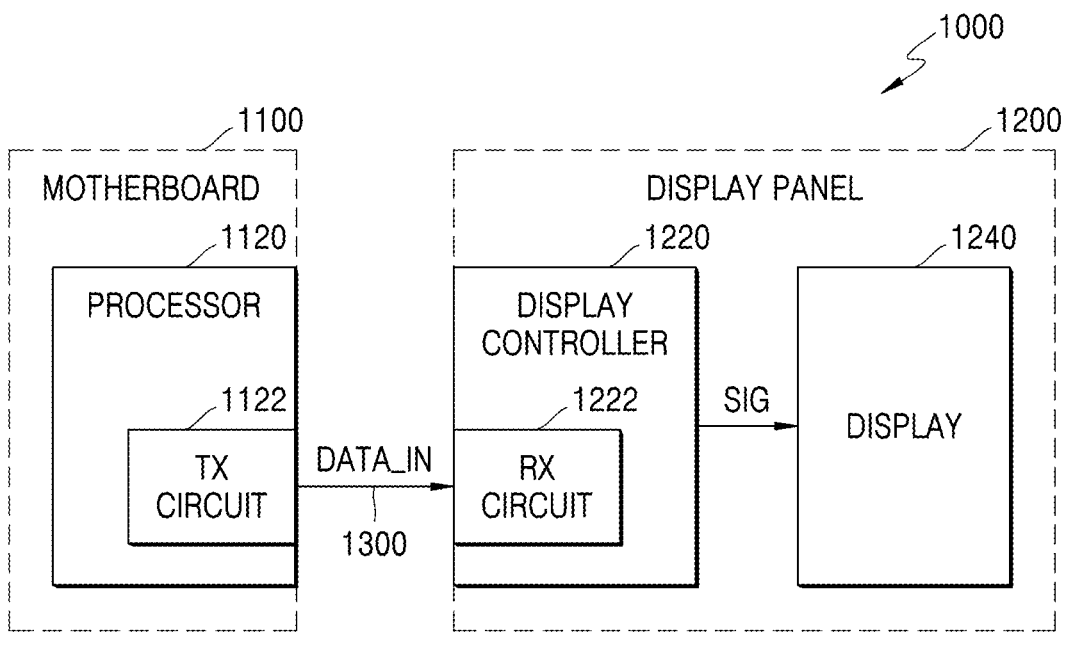
FIG. 12 is a block diagram showing a device including a clock and data recovery circuit, according to an embodiment.

FIG. 12 is a block diagram showing a device including a clock and data recovery circuit, according to an embodiment.

The clock and data recovery circuit according to an embodiment may be included in a receiving circuit 1222. A device 1000 may be a computing system including a display panel 1200, and, as a non-limiting example, may be a stationary system such as a desktop computer, a server, a TV, or an electronic sign, or may be a mobile system such as a laptop computer, a mobile phone, a tablet PC, or a wearable device. As shown in FIG. 12, the device 1000 may include a motherboard 1100 and a display panel 1200, and input data DATA_IN may be transferred from the motherboard 1100 to the display panel 1200 through a data line 1300.

The motherboard 1100 may include a processor 1120, and the processor 1120 may include a transmission circuit 1122. The processor 1120 may refer to a processing unit that performs a computational operation, such as, for example, a microprocessor, a microcontroller, an application specific integrated circuit (ASIC), or a field programmable gate array (FPGA). In some embodiments, the processor 1120 may be a video graphics processor such as a graphic processing unit (GPU). The processor 1120 may generate image data corresponding to an image output through a display 1240 included in the display panel 1200, and the image data may be provided to the transmission circuit 1122.

The transmission circuit 1122 may receive image data and generate the input data DATA_IN by converting the image data into serial data. For example, the transmission circuit 1122 may generate the input data DATA_IN such that pixel data corresponding to one pixel of the display 1240 corresponds to one packet. As described above with reference to FIG. 1, the input data DATA_IN may include an embedded clock.

The display panel 1200 may include a display controller 1220 and a display 1240. The display controller 1220 may receive the input data DATA_IN including serial data from the motherboard 1100 and provide a display signal SIG to the display 1240 by processing the input data DATA_IN. In some embodiments, the display controller 1220 may provide the display signal SIG for controlling pixels included in the display 1240, and may be referred to as a display driver IC (DDI).

The display controller 1220 may include the receiving circuit 1222, and the receiving circuit 1222 may receive the input data DATA_IN. The receiving circuit 1222 may include a clock and data recovery circuit according to embodiments, and may recover a clock and data from the input data DATA_IN. As the resolution of the display 1240 increases and the number of images updated through the display 1240, that is, a frame rate increases, the amount of data transmitted from the motherboard 1100 to the display panel 1200 may significantly increase.

The display 1240 may include, as a non-limiting example, any type of display, such as a liquid crystal display (LCD), a light emitting diode (LED), an electroluminescent display (ELD), a cathode ray tube (CRT), a plasma display panel (PDP), and a liquid crystal on silicon (LCoS). In FIG. 12, the device 1000 is shown as including one display panel 1200, but in some embodiments, the device 1000 may include two or more display panels, that is, two or more displays.

According to embodiments described above, the phase and frequency detector 100 may stably detect a phase and a frequency despite distortions such as skew and jitter of data. According to embodiments described above, the clock and data recovery circuit 10 may track frequency errors without a separate frequency locking loop and may quickly find a target frequency, thereby simplifying the overall system structure.

Figure 13:
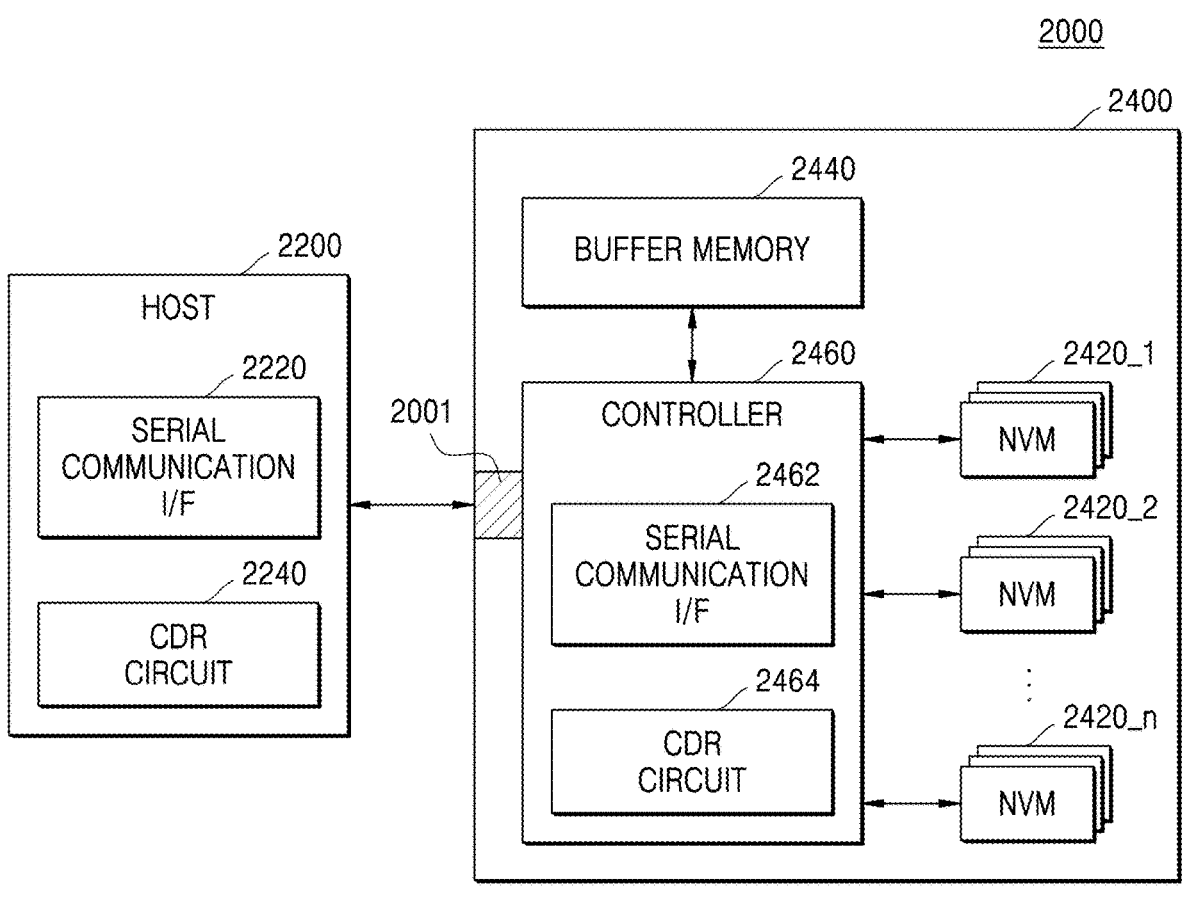
FIG. 13 is a block diagram showing a system including a clock and data recovery circuit, according to an embodiment.

FIG. 13 is a block diagram showing a system including a clock and data recovery circuit, according to an embodiment.

Referring to FIG. 13, a system 2000 may include a host 2200 and a storage device 2400. The storage device 2400 may be referred to as a memory system or a storage system, and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive a signal to and from the host 2200 through the signal connector 2001. The host 2200 and the storage device 2400 may communicate through electrical signals and/or optical signals, and communicate through, as a non-limiting example, universal flash storage (UFS), serial advanced technology attachment (SATA), SATA express (SATAe), small computer small interface (SCSI), serial attached SCSI (SAS), peripheral component interconnect express (PCIe), non-volatile memory express (NVMe), advanced host controller interface (AHCI), or a combination thereof.

The controller 2460 may control the plurality of non-volatile memories 2420_1 to 2420_n in response to a signal received from the host 2200. The controller 2460 may include a serial communication interface circuit 2462 for data transmission and reception, and include a clock and data recovery circuit 2464, according to an embodiment, to recover a clock and data of the received serial data. The serial communication interface circuit 2462 may provide a communication interface such as, for example, UFS, SATA, SATAe, SCSI, SAS, PCIe, NVMe, and AHCI. The buffer memory 2440 may operate as a buffer memory of the storage device 2400. The host 2200 may include a serial communication interface circuit 2220 for data transmission and reception and a clock and data recovery circuit 2240 according to embodiments.

Each of the non-volatile memories 2420_1 to 2420_n may include a memory cell array, the memory cell array may include memory blocks, each of the memory blocks may be divided into pages, and each page may include non-volatile memory cells, for example, at least one NAND flash memory cell.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. An integrated circuit, comprising:

a phase shifted data generation circuit configured to generate a plurality of phase shifted data from input data, based on a plurality of clock signals having different phases;

a synchronization circuit configured to generate a plurality of synchronization data by applying the plurality of clock signals to the plurality of received phase shifted data; and a control signal generation circuit configured to generate a reference clock signal that controls at least one of a phase and a frequency of the reference clock signal by performing a logical operation on the plurality of synchronization data, wherein the plurality of clock signals includes the reference clock signal and at least one phase shifted clock signal having a phase difference of a predetermined interval with respect to the reference clock signal, and a phase interval between two pieces of data having a largest phase difference from among the plurality of synchronization data on which the logical operation is based is greater than a signal cycle of the reference clock signal.

2. The integrated circuit of claim 1, wherein the plurality of phase shifted data includes at least one unequal phase shifted data formed by sampling, as a target, a position having a phase difference greater than or equal to a critical phase value at a boundary between signals of the input data.

3. The integrated circuit of claim 2, wherein the reference clock signal operates based on a half-rate, and the at least one phase shifted clock signal includes:

a plurality of equal clock signals having a phase difference of natural multiples of 90 degrees with respect to the reference clock signal; and at least one unequal clock signal having a phase difference of P degree with respect to any one of the plurality of equal clock signals, wherein P is a positive integer less than 90, and the at least one unequal phase shifted data is generated based on the at least one unequal clock signal.

4. The integrated circuit of claim 3, wherein the at least one phase shifted clock signal includes clock signals having a phase difference of about 45 degrees, about 90 degrees, about 180 degrees, about 270 degrees, and about 315 degrees with respect to the reference clock signal, respectively, and the at least one unequal phase shifted data is generated based on clock signals having a phase difference of about 45 degrees and about 315 degrees with respect to the reference clock signal, respectively.

5. The integrated circuit of claim 3, wherein the at least one phase shifted clock signal includes clock signals having a phase difference of about 90 degrees and about 270 degrees with respect to the reference clock signal, respectively, and the at least one unequal phase shifted data is generated based on clock signals having a phase difference of about 90 degrees and about 270 degrees with respect to the reference clock signal, respectively.

6. The integrated circuit of claim 2, wherein the reference clock signal operates based on a full-rate, and the at least one phase shifted clock signal includes:
a plurality of equal clock signals having a phase difference of natural multiples of 180 degrees with respect to the reference clock signal; and
at least one unequal clock signal having a phase difference of P degree with respect to any one of the plurality of equal clock signals,
wherein P is a positive integer less than 180, and the at least one unequal phase shifted data is generated based on the at least one unequal clock signal.

7. The integrated circuit of claim 1, wherein the reference clock signal includes a phase control signal that controls a phase of the reference clock signal and a frequency control signal that controls a frequency of the reference clock signal.

8. The integrated circuit of claim 1, wherein the phase shifted data generation circuit includes a plurality of flip-flops configured to receive the plurality of clock signals one by one, and the plurality of flip-flops is connected in parallel to each other and is each configured to output the plurality of synchronization data from the input data to the synchronization circuit.

9. An operating method of an integrated circuit that generates a phase control signal that controls a phase of a reference clock signal and a frequency control signal that controls a frequency of the reference clock signal, based on input data and the reference clock signal, the operating method comprising:

generating a plurality of phase shifted data from the input data, based on a plurality of clock signals having different phases;
generating a plurality of synchronization data by applying the plurality of clock signals to the plurality of phase shifted data; and
generating the phase control signal and the frequency control signal by performing a logical operation on the plurality of synchronization data,
wherein the plurality of clock signals includes the reference clock signal and at least one phase shifted clock signal having a phase difference of a predetermined interval with respect to the reference clock signal, and
a phase interval between two pieces of data having a largest phase difference from among the plurality of synchronization data on which the logical operation is based is greater than a signal cycle of the reference clock signal.

10. The operating method of claim 9, wherein the plurality of phase shifted data includes at least one unequal phase shifted data formed by sampling, as a target, a position having a phase difference greater than or equal to a critical phase value at a boundary between signals of the input data.

11. The operating method of claim 10, wherein the reference clock signal operates based on a half-rate, and the at least one phase shifted clock signal includes:
a plurality of equal clock signals having a phase difference of natural multiples of 90 degrees with respect to the reference clock signal; and
at least one unequal clock signal having a phase difference of P degree with respect to any one of the plurality of equal clock signals,
wherein P is a positive integer less than 90, and the at least one unequal phase shifted data is generated based on the at least one unequal clock signal.

12. The operating method of claim 11, wherein the at least one phase shifted clock signal includes clock signals having a phase difference of about 45 degrees, about 90 degrees, about 180 degrees, about 270 degrees, and about 315 degrees with respect to the reference clock signal, respectively, and the at least one unequal phase shifted data is generated based on clock signals having a phase difference of about 45 degrees and about 315 degrees with respect to the reference clock signal, respectively.

13. The operating method of claim 12, wherein the at least one phase shifted clock signal includes clock signals having a phase difference of about 90 degrees and about 270 degrees with respect to the reference clock signal, respectively, and the at least one unequal phase shifted data is generated based on clock signals having a phase difference of about 90 degrees and about 270 degrees with respect to the reference clock signal, respectively.

14. The operating method of claim 10, wherein the reference clock signal operates based on a full-rate, and the at least one phase shifted clock signal includes:
a plurality of equal clock signals having a phase difference of natural multiples of 180 degrees with respect to the reference clock signal; and
at least one unequal clock signal having a phase difference of P degree with respect to any one of the plurality of equal clock signals,
wherein P is a positive integer less than 180, and the at least one unequal phase shifted data is generated based on the at least one unequal clock signal.

15. A clock and data recovery circuit, comprising:
a phase and frequency detection circuit configured to generate a phase control signal that controls a phase of a reference clock signal and a frequency control signal that controls a frequency of the reference clock signal, based on input data and the reference clock signal;
a loop filter configured to generate a frequency control word that controls a frequency of the reference clock signal, based on the received phase control signal and the frequency control signal; and
an oscillator configured to generate the reference clock signal by oscillating based on the received frequency control signal,
wherein the phase and frequency detection circuit is configured to generate the frequency control signal by performing a logical operation on a plurality of first data generated based on the received reference clock signal and the input data, and
a phase interval between two pieces of data having a largest phase difference from among the plurality of first data on which the logical operation is based is greater than a signal cycle of the reference clock signal.

16. The clock and data recovery circuit of claim 15, wherein the plurality of first data includes at least one unequal data formed by sampling, as a target, a position having a phase difference greater than or equal to a critical phase value at a boundary between signals of the input data.

17. The clock and data recovery circuit of claim 16, wherein the oscillator is configured to generate the reference clock signal based on a half-rate, wherein the plurality of first data includes:

a plurality of equal clock data having a phase difference of natural multiples of 90 degrees with respect to the reference clock signal; and at least one unequal clock data having a phase difference of P degree with respect to any one of the plurality of equal clock data, wherein P is a positive integer less than 90, and the at least one unequal data is generated based on the at least one unequal clock data.

18. The clock and data recovery circuit of claim 17, wherein the plurality of first data includes data having a phase difference of about 45 degrees, about 90 degrees, about 180 degrees, about 270 degrees, and about 315 degrees with respect to the reference clock signal, respectively, and the at least one unequal data is generated based on data having a phase difference of about 45 degrees and about 315 degrees with respect to the reference clock signal, respectively.

19. The clock and data recovery circuit of claim 17, wherein the plurality of first data includes data having a phase difference of about 90 degrees and about 270 degrees with respect to the reference clock signal, respectively, and the at least one unequal data is generated based on data having a phase difference of about 90 degrees and about 270 degrees with respect to the reference clock signal, respectively.

20. The clock and data recovery circuit of claim 16, wherein the oscillator is configured to generate the reference clock signal based on a full-rate, the plurality of first data includes:

a plurality of equal clock data having a phase difference of natural multiples of 180 degrees with respect to the reference clock signal; and at least one unequal clock data having a phase difference of P degree with respect to any one of the plurality of equal clock data, wherein P is a positive integer less than 180, and the at least one unequal data is generated based on the at least one unequal clock data.

* * * * *